United States Patent [19]

Eichelberger et al.

[11] 4,063,080
[45] Dec. 13, 1977

[54] METHOD OF PROPAGATION DELAY TESTING A LEVEL SENSITIVE ARRAY LOGIC SYSTEM

[75] Inventors: Edward Baxter Eichelberger, Purdy Station, N.Y.; Eugene Igor Muehldorf, Potomac, Md.; Ronald Gene Walther, Vestal, N.Y.; Thomas Walter Williams, Longmont, Colo.

[73] Assignee: International Business Machines Corporation, Armonk, N.Y.

[21] Appl. No.: 701,041

[22] Filed: June 30, 1976

[51] Int. Cl.² .......................................... G06F 11/00
[52] U.S. Cl. ............................... 235/302; 324/73 AT
[58] Field of Search ............... 235/153 AC, 151.31; 324/73 R, 73 AT, 73 PC, 57 DE

[56] References Cited

U.S. PATENT DOCUMENTS

| | | | |
|---|---|---|---|
| 3,659,088 | 4/1972 | Boisvert, Jr. | 324/73 AT X |
| 3,714,403 | 1/1973 | Ammann et al. | 235/153 AC |
| 3,784,907 | 1/1974 | Eichelberger | 324/57 DE |

OTHER PUBLICATIONS

E. Lindbloom et al. "Program For Determining Reset--On Time in Weighted Adaptive Test Patterns" *IBM Tech. Discl. Bulletin*, July 1972, pp. 399-400.

P. Goel "Testing of Random Logic" *IBM Tech. Disc. Bulletin*, vol. 16, No. July 1973, pp. 429-430.

*Primary Examiner*—David H. Malzahn
*Attorney, Agent, or Firm*—Wesley DeBruin

[57] ABSTRACT

Propagation delay testing is performed on a generalized and modular logic system that contains embedded arrays and can be used as arithmetic/logical/control unit in a digital computer or data processing system. Each such unit can be composed of combinatorial logic and storage circuitry. The storage circuitry may be of two types, randomly arranged latches, or arrays of storage cells. In the organization presented here the latches are arranged such that they have the capability of performing scan-in/scan-out operations independently of system control. Using this scan capability, the method of the invention provides for the state of the storage latches to be preconditioned and independent of prior circuit history. Selected propagation paths are sensitized by patterns from an automated test generator of designer supplied patterns. By alternating selected inputs and by applying proper timing control, propagation delay indications through the selected paths are obtained to determine delay behavior of the logic system.

25 Claims, 11 Drawing Figures

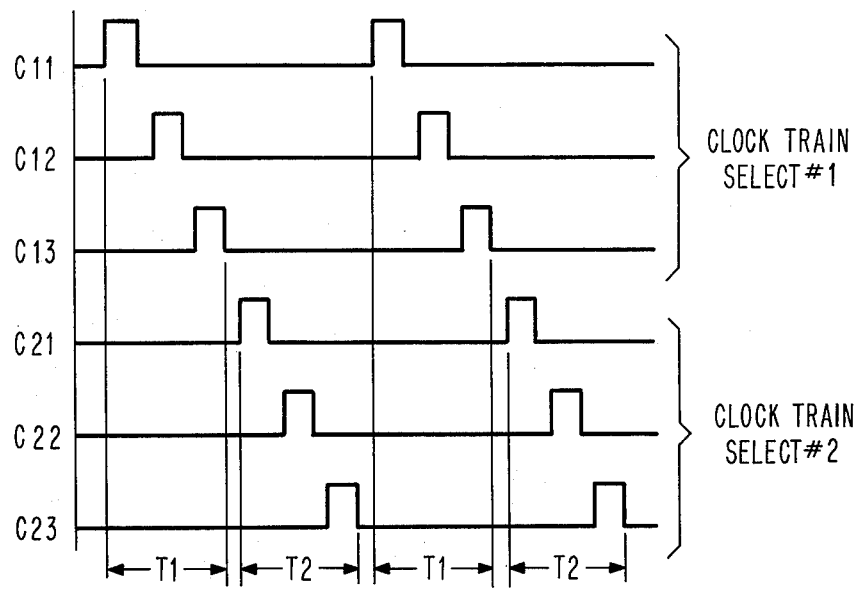
FIG. 3
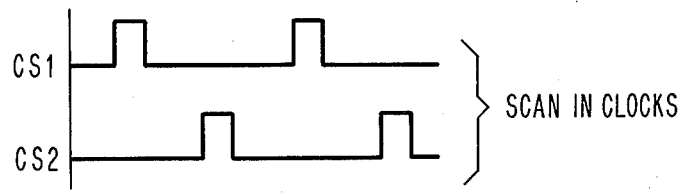
FIG. 4
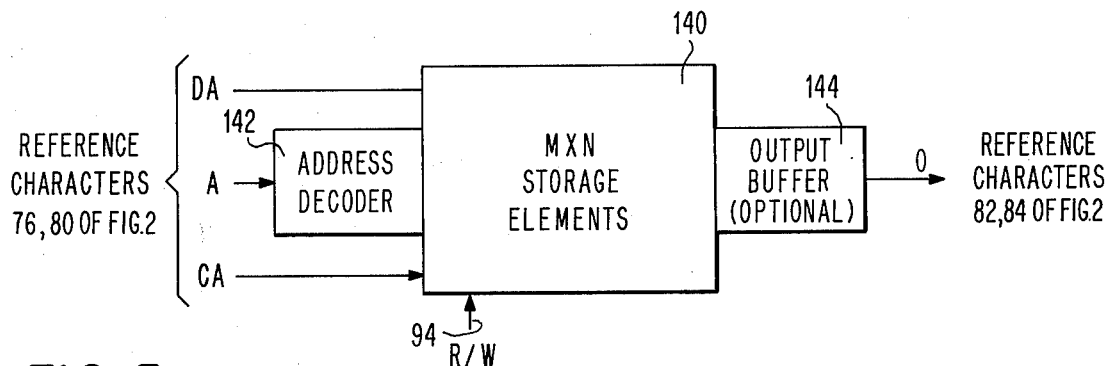
FIG. 5
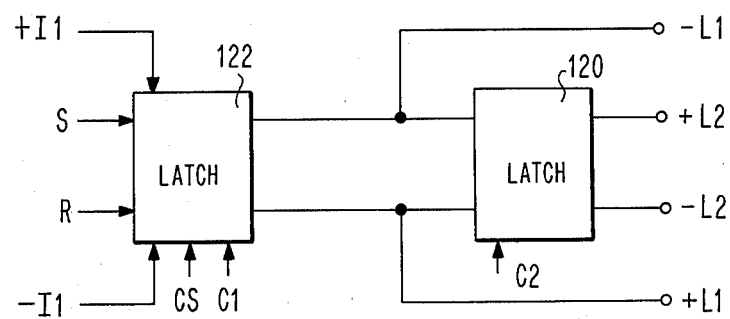
FIG. 8   SHIFT REGISTER LATCH

METHOD OF PROPAGATION DELAY TESTING A LEVEL SENSITIVE ARRAY LOGIC SYSTEM

BACKGROUND OF THE INVENTION

Field of the Invention

This invention relates to the logic systems which incorporate arrays into general purpose digital computers. More particularly, this invention relates to testing path delays through a functional organization of logic in a modular generalized level sensitive fashion.

Cross-Reference to Related Applications and Patents

U.S. patent application Ser. No. 701,052, entitled "Level Sensitive Embedded Array Logic System", filed June 30, 1976, by Messrs. E. B. Eichelberger, E. I. Muehldorf, R. G. Walther and T. W. Williams, and of common assignee.

U.S. patent application Ser. No. 701,054, entitled "Method of Level Sensitive Testing A Functional Logic System With Embedded Array", filed June 30, 1976, by Messrs. E. B. Eichelberger, E. I. Muehldorf, R. G. Walther and T. W. Williams, and of common assignee.

U.S. patent application Ser. No. 701,053, entitled "Reduced Overhead for Gated B Clock Testing", filed June 30, 1976, by Messrs. E. B. Eichelberger and T. W. Williams and of common assignee.

U.S. patent application Ser. No. 589,231, entitled, "High Density Semiconductor Chip Organization", by E. B. Eichelberger and G. J. Robbins, filed June 23, 1975 granted as U.S. Pat. No. 4,006,492 on Feb. 1, 1977 and of common assignee.

U.S. patent application Ser. No. 701,055, entitled "Implementation of Level Sensitive Logic System Accordion Register Means" by Hua-Tung Lee, filed June 30, 1976 and of common assignee.

U.S. patent application Ser. No. 701,376, entitled "Clock Generation Network" by E. B. Eichelberger and S. DasGupta, filed June 30, 1976 and of common assignee.

U.S. patent application Ser. No. 534,606, filed Dec. 20, 1974, entitled "Testing Embedded Array", by E. B. Eichelberger, granted as U.S. Pat. No. 3,961,252 on June 1, 1976 and of common assignee.

U.S. patent application Ser. No. 534,608, entitled "Testing Embedded Arrays", by J. R. Cavaliere and R. Robortaccio, filed Dec. 20, 1974, granted as U.S. Pat. No. 3,961,254 on June 1, 1976 and of common assignee.

U.S. patent application Ser. No. 534,605, entitled "Testing Embedded Arrays" filed Dec. 20, 1974, by W. P. Hurley and H. P. Muhlfeld, granted as U.S. Pat. No. 3,961,251 on June 1, 1976 and of common assignee.

U.S. Pat. No. 3,783,254, entitled "Level Sensitive Logic System", application Ser. No. 297,543, filed Oct. 16, 1972 granted Jan. 1, 1974 to Edward B. Eichelberger and of common assignee.

U.S. Pat. No. 3,761,695, entitled, "Method of Level Sensitive Testing a Functional Logic System", application Ser. No. 298,087, filed Oct. 16, 1972, granted Sept. 25, 1973 to Edward B. Eichelberger and of common assignee.

U.S. Pat. No. 3,784,907, entitled "Method of Propagation Delay Testing a Functional Logic System", application Ser. No. 298,071, filed Oct. 16, 1972, granted Jan. 8, 1974 to Edward B. Eichelberger and of common assignee.

Description of Prior Art

In the past designers of computer logic incorporating arrays had complete freedom in arranging logic circuitry and arrays for implementing system and subsystem logic functions for central processing units, channels and control units employed in digital computing machines and the like. This freedom has resulted in a significant variety of design implementations. Each of these implementations has its own dependency on delay and AC characteristics of the individual circuits employed in the system. A well defined interface between logic designer and component manufacturer existed and testing methods could be specified to the satisfaction of both designer and manufacturer. The AC parameters such as rise time, fall time, individual circuit delay as well as other significant delay parameters were readily testable since access to the circuit parts could be readily established.

With the advent of large scale integration (hereinafter referred to as LSI), this interface between designer and manufacturer has been changed significantly. LSI provides the ability for the logic designer and the manufacturer to place thousands of circuits on a single chip of semiconductor material. Such a capability offers the possibility to reduce power and cost of semiconductor circuits while increasing their performance. However, with such dense configurations it is either impossible or impractical to test each and every circuit for all the well known AC circuit parameters. As a result it is necessary to divide and partition logic systems and subsystems into units that are substantially insensitive to variations in these parameters. A general and modular system subdivision of this type is described in U.S. Pat. No. 3,783,254 entitled "Level Sensitive Logic System" granted Jan. 1, 1974 to E. B. Eichelberger on application Ser. No. 297,543, filed Oct. 16, 1972. Such functional units require testing methods that measure the performance of the entire functional package. The testing methods of the past are not suited to determine the performance of such functional units.

The above referenced system does not address or teach the case of computing circuitry that uses embedded arrays. Arrays are a convenient physical arrangement of memory and or logic cells. Some logic designs will be significantly simplified by making use of such arrays. The case of arrays embedded in a level sensitive structure is described in U.S. patent application Ser. No. 701,052, "Level Sensitive Embedded Array Logic System", filed June 30, 1976 by E. B. Eichelberger, T. W. Williams, E. I. Muehldorf and R. G. Walthers, and of common assignee herewith. Application Ser. No. 701,054, filed June 30, 1976, discloses the organization, arrangement and DC testing methods for Level Sensitive Embedded Array Logic Systems.

In the past, for example, it was possible to test each individual circuit or embedded array for the usual normal and customary AC and DC performance parameters. In addition arrays were not embedded and were separated from logic. Access to the arrays or modular units for application of testing input conditions and the measuring of output responses has been achieved through a fixed number of input/output connection pins, however, in the realm of LSI functional units, the same number of input and output pins are available, but there is a significantly increased number of circuits intermixed with arrays on one chip. Independent access is no longer available.

Thus, in a typical module containing, say, 100 chips, with logic chips having up to 600 typical circuits and 25 chips containing arrays, the module would contain at least 30000 circuits and 25 arrays. Parametric testing of such a unit is not possible. AC testing of all logic which does not feed arrays or is not fed by arrays can be performed by the structure and methods disclosed in U.S. Pat. Nos. 3,783,254; 3,761,695 and 3,784,907. If functional testing of the arrays is attempted on such a unit having prior art logic design configurations, the extent of coverage of logic immediately around the array and for the array itself would be significantly low and the level of reliability for use in computing systems would also be accordingly low. Therefore, provisions must be made for improving the art. Current logic/array systems logic configurations must be avoided and a novel organization must be used which will allow AC testing if the advantages of LSI are to be enjoyed. The testing of these configurations must be performed in a functional manner on the chip, module or package level. Such testing requires that automatic test patterns generation be utilized in providing the patterns for application to the entire logic system.

The ABSTRACT of U.S. Pat. No. 3,783,254, entitled "Level Sensitive Logic System" reads as follows:

"A generalized and modular logic system for all arithmetic/logical units of a digital computer. Each arithmetic/logical unit of a computer is partitioned into sections formed of combinational logic networks and storage circuitry. The storage circuitry is sequential in operation and employs clocked dc latches. Two or more synchronous, non-overlapping, independent system clock trains are used to control the latches. A single-sided delay dependency is imparted to the system. The feedback connections from the respective latch circuitry are made through combinational logic to other latch circuitry that has a system clock other than the system clock acting on the initiating latch circuitry. With each latch, there is provided additional circuitry so that each latch acts as one position of a shift register having input/output and shift controls that are independent of the system clocks and the system inputs/outputs. All of the shift register latches are coupled together into a single shift register."

The ABSTRACT of U.S. Pat. No. 3,761,695, entitled "Method of Level Sensitive Testing A Functional Logic System", reads as follows:

"Level sensitive testing is performed on a generalized and modular logic system that is utilized as an arithmetic/logical unit in a digital computer. Each arithmetic/logical unit of a computer is formed of arrangements of combinational logic networks and storage circuitry. The storage circuitry has the capability for performing scan-in/scan-out operations independently of the system input/output and controls. Using this scan capability, the method of the invention provides for the state of the storage circuitry to be preconditioned and independent of its prior history. Test patterns from an automatic test generator are cycled through the networks of combinational logic and their respective associated storage circuitry for removal through the scan arrangement to determine their fault status."

The ABSTRACT of U.S. Pat. No. 3,784,907, entitled "Method of Propagation Delay Testing a Functional Logic System" reads as follows:

"Propagation delay testing is performed on a generalized and modular logic system that is utilized as an arithmetic/logical unit in a digital computer. Each arithmetic/logical unit of a computer is formed of arrangements of combinational logic networks and storage circuitry. The storage circuitry has the capability for performing scan-in/scan-out operations independently of the system input/output and controls. Using this scan capability, the method of the invention provides for the state of the storage circuitry to be preconditioned and independent of its prior history. Selected propagation paths through the system circuitry are sensitized by test patterns from an automatic test generator. By altering selected inputs and cycling controls applied to the networks of combinational logic and their respective associated storage circuitry, propagation delay indications through the selected paths are obtained to determine the status of these path delays through the logic system".

SUMMARY OF THE INVENTION

In contrast to logic organizations of prior art, it is an aspect of the invention to teach an organization of logic and arrays which is oriented towards testing and which is applicable to all levels of the hierarchy of modular units. The method of testing is implementable on a general logic and array system having a scan-in/scan-out capability. Such an organization has a single-sided delay dependency and the delay depends solely on the occurrence of plural system clock trains.

A logic organization including arrays which is testable according to the method of the invention employs clocked DC latches for all internal circuitry in the arithmetic, logical, and control units of the computing system. The latch circuitry is partitioned along with associated combinatorial logic networks and arrays and arranged in sets. The plural clock trains are synchronous but non-overlapping and logically independent. The sets of latch circuitry are coupled through combinatorial logic and arrays to other sets of latches that are controlled by other system clock trains. One method of accomplishing this objective is to use one system clock to set the latches feeding the logic and array and a different system clock to set the latches fed by the array and the logic.

In addition to the organization of logic, arrays, and latches into a system having a single sided delay dependency, which produces race and hazard free operation, this invention provides the incorporation of circuitry into the latches which effects the scan-in/scan-out operation. This additional circuitry allows for all latches to become shift register latches and by external control to be connected into one or more shift registers. These shift registers have a single input and a single output and can be activated by clocks independent of the system clocks. With the additional circuitry all system clocks can be deactivated, thus isolating all sets of latch circuits from one another. The effect of this isolation coupled with the scan-in/scan-out capability is to reduce all the sequential circuitry that contains arrays to arrays which are being fed by combinatorial circuitry and which, in turn, feed combinatorial circuitry. This permits automatic test generation to be provided for measuring the propagation delays through selected paths of the logic/array combination.

In order to perform the inventive method the combination of logic and arrays system under test is set up to perform a dynamic AC measurement. The latch circuitry is organized into sets and initialized. This is accomplished by shifting a test pattern into the latch circuits of the register using the scan access. In addition to initializing the latch circuitry test patterns are applied to other inputs of the logic/array system under test. The application of the test patterns to the system inputs and the latches involves sensitizing a selected path of the logic/array system. Such a path flows through the combinatorial logic and the array and the effect is a conditioning of the inputs to the individual networks in a manner such that when one of the inputs is changed, propagation of the change takes place through the particular sensitized path to a location of measurement. To effect the change a primary input is altered. After a predetermined lapse of time has followed the changing of the input, any change occurring at the output of the sensitized path through the combinatorial circuit/array network is measured.

In essence eight types of sensitized paths must be considered for delay testing in a logic/array/latch system involving the array. These include:
- a. A path P1 from a primary input, through a latch, through combinational logic, through the array, through combinatorial logic ending either at a latch or a system primary output;
- b. A path P2 from a primary input, through combinatorial logic, through the array, through combinatorial logic ending at either a latch or a system primary output;
- c. A path P3 from a primary input through the array, through combinatorial logic, ending at either a latch or a system primary output;
- d. A path P4 from a primary input through a latch through the array, through combinatorial logic ending either at a latch or a system primary output;
- e. A path P5 through a latch, through combinatorial logic, through the array, ending at either a latch or a system primary output;
- f. A path P6 through a latch, through the array, ending in either a latch or a system primary output;
- g. A path P7 from a primary input, through combinatorial logic, through the array, ending in either a latch or a system primary output;
- h. A path P8 from a primary input, through the array ending either in a latch or a system primary output.

While further and other paths are possible they will not involve the array. These further and other paths, which do not concern the array, are disclosed in U.S. Pat. No. 3,784,907, "Method of Propagation Delay Testing A Functional Logic System" granted to E. B. Eichelberger. A system or package primary input as used in this context is either a system input or a clock input provided at a particular time. A system or package primary output in this context is an output that connects directly the combinatorial logic and latch combination and provides a system output. The ability to shift test patterns into and out of the sets of latches arranged as one or more shift registers using the independent scan access and control, coupled with the independence of the clock signal, renders it possible to perform the dynamic testing of these types of paths for propagation delays.

Dependent on the particular path that has been sensitized for measurement of propagation delays, the measurement may occur either by direct observation or by exercising another clock train so as to gate the output of a combinatorial circuit/array network into a latch set. In the latter instance the result of the test may be shifted out using the scan access and controls for measurement. For those paths which run to a primary system or package output the measurement may be performed either directly or the result of the test may be captured in an auxiliary latch which is not part of the LSI circuit but a part of the testing apparatus. For those paths which run to a latch set which is part of the LSI circuit the measurement is performed by clocking the result of the measurement through the combinatorial logic/array combination into the set of latches and then shifting out using the scan access and controls. For those paths of the type P2, P3, P7 and P8, described above, which are originating at a primary input connected to combinatorial logic or the array, the change to be propagated to an output or a latch may be applied directly or by an auxiliary latch which is not part of the LSI circuitry, but a part of the testing apparatus. For paths of the type P1, P4, P5, P6 as described above, which do include a latch prior to actuating the logic/array combination or the array, the change requires a change to be applied through the latch. This may require simultaneous application of sensitizing conditions as well as change to all input lines and may require auxiliary latches in the testing apparatus. In all instances interrogation is made as to whether the output changes to a new value. If there has not been any change when the propagation delay through the selected paths exceeds a predetermined value, the particular units under test are rejected as being outside of the set specifications. The part may be retested if so desired for different specifications for which the part may be acceptable. If, on the other hand a change did take place, an indication is provided that the propagation delay is within the particular specifications and the unit under test is accepted.

In particular, three types of AC testing for logic/array combinations can be carried out by the method using this logic organization. The first one involves the propagation of a transition applied at an input to an output and observation thereof. The second one requires that the latch sets be connected in a fashion that between each latch feeding the logic/array combination there is an auxiliary latch. These auxiliary latches may be the latches fed by the logic/array combination and serving as output latches. Inputs which are primary system inputs, that is inputs feeding the logic/array combination directly and not through the input latches, may require auxiliary latches in the testing apparatus. The test is now performed by applying the input pattern to the shift register latches in the configuration chained together for testing. The test pattern is not applied to the latches feeding the logic/array combination, but to the auxiliary latches. In the next step the test pattern is moved simultaneously from the auxiliary latches into the latches feeding the logic array combination, as well as simultaneously applying the test pattern to the primary inputs, either directly or via the auxiliary latches. The test pattern propagates through the logic/array combination and at a prescribed point in time later, the receiving latches at the output are sensitized and the result of the test is captured. For test results now stored in the latches which are part of the LSI logic the register is again activated and the tests are read out. The third method also involves loading the test pattern into the shift register. The test is propagated at machine speed or at a specified margin above the machine speed through the logic/array combination, whereupon it is captured and evaluated. In this fashion the method offers the possibility for marginal delay fault testing. This method also permits the sorting of the LSI parts according to delay parameter bands.

In this manner, automatically generated test patterns are provided one at a time to the functional logic and array unit being measured or tested. Each set of patterns is shifted into the register or registers and also provided as input signals to the functional logic/array unit. By effecting a change in one of the system inputs or in one of the clock trains, a selected path is sensitized through at least a portion of the logic unit including the array. Depending on the portion selected, a measurement is made to determine that the requisite specification for propagation delay has been met. Repeating this procedure with a substantial number of test patterns from an automatic test pattern generator provides a clear indication of the propagation delays through the unit under test.

A primary object of the invention is to provide a "Method of Propagation Delay Testing A Level Sensitive Embedded Array Logic System".

A primary object of the invention is to provide a "Method of Propagation Delay Testing A Level Sensitive Embedded Array Logic System" package, where the level of the package may be a chip, module, card, board, subsystem or system.

A primary object of the invention is to provide an improved method of testing a generalized and modular logic system generally of the type described in U.S. patent application Ser. No. 701,052 filed June 30, 1976, and entitled "Level Sensitive Embedded Array Logic System".

A further object of the invention is to provide an improved method of testing high circuit density structures and devices.

A further object of the invention is to provide an improved method of testing monolithic devices fabricated by large scale integration techniques and containing combinatorial logic and array circuitry.

The foregoing and other objects, features and advantages of the invention will be apparent from the following more particular description of a preferred embodiment of the invention, as illustrated in the accompanying drawings.

DESCRIPTION OF DRAWINGS

FIG. 3: Timing diagram of system clock trains.

FIG. 4: Timing diagram of scan clock trains.

FIG. 5: Organization of the array.

FIG. 8: Schematic of the latch pair.

DESCRIPTION OF THE PREFERRED EMBODIMENT

The generalized and modular logic system of the invention having single-sided delay dependency and scan-in/scan-out capability may be utilized for testing of the propagation delays of selected sensitized paths through a mixture of combinatorial logic and arrays. Such a system is described with particularity in the aforementioned U.S. patent application Ser. No. 701,052, entitled "Level Sensitive Embedded Array Logic System" filed June 30, 1976 by E. B. Eichelberger, E. I. Muehldorf, R. G. Walther and T. W. Williams, and of common assignee herewith. Systems of this type are employed in the arithmetic and/or logical units (ALU), the control unit and the data channeling units of a computing system. The general configuration of the system taught in this patent is also applicable to memory arrays and combinatorial logic macros, that is logic entities arranged in a preferred physical arrangement such as programmable logic arrays (PLA), U.S. Pat. No. 3,593,317, entitled "Partitioning Logic Operations In A Generalized Matrix System", by H. Fleisher et al., granted July 13, 1971, and of common assignee.

Figure 2:
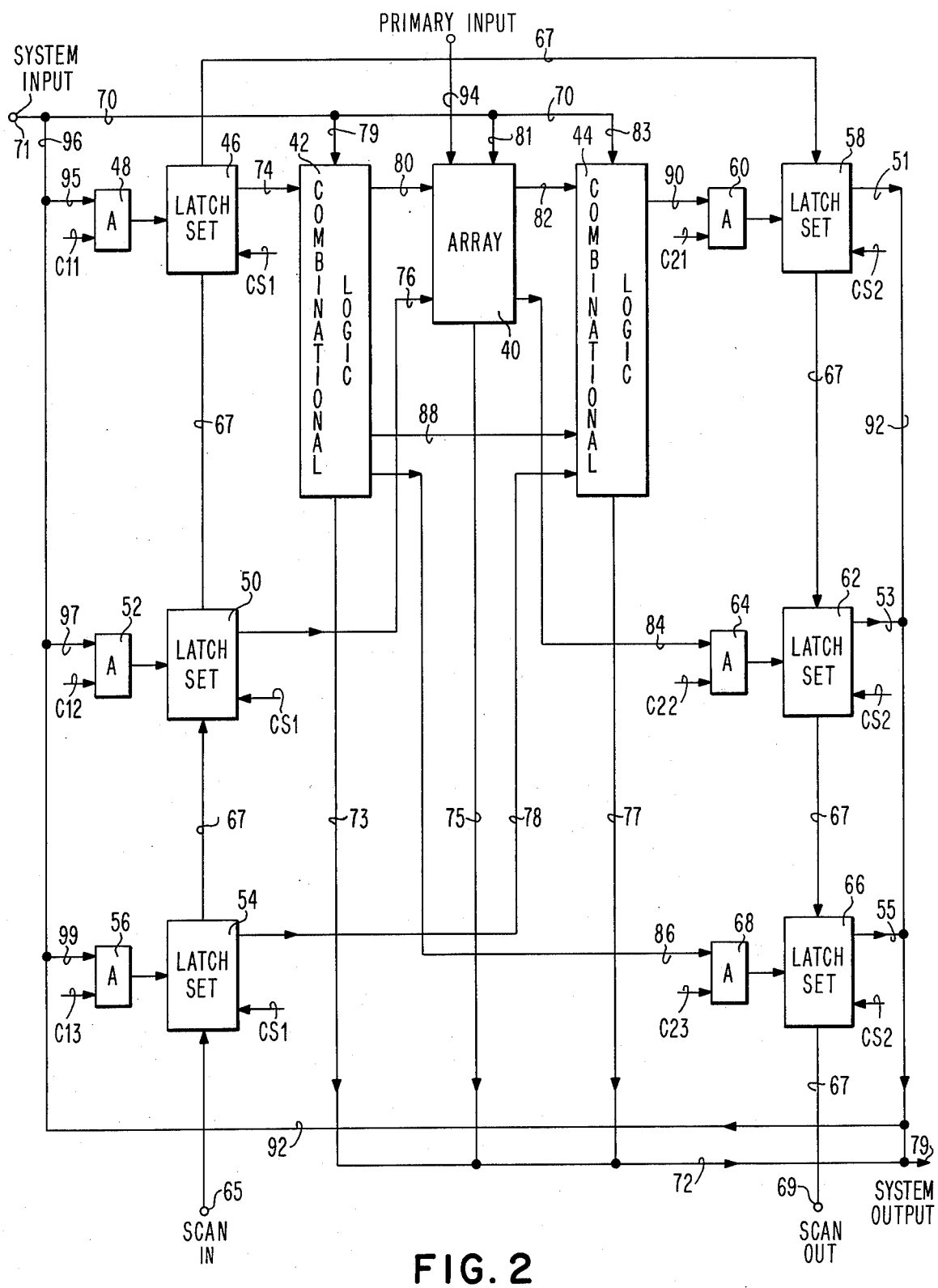
FIG. 2: Schematic of the organization of the generalized logic with embedded arrays.

It is to be appreciated that the array as broadly depicted by reference character 40 in FIG. 2 may be a $m \times n$ memory array (FIG. 5) or a programmable logic array, each of which may be generally of a type well-known to the art. Reference is made to: U.S. Pat. No. 3,593,317, entitled "Partitioning Logic Operations in a Generalized Matrix System", granted July 13, 1971 to H. Fleisher, A. Weinberger, et al.; U.S. Pat. No. 3,863,232, entitled "Associative Array", granted Jan. 28, 1975 to D. D. Johnson, et al.; U.S. Pat. No. 3,936,812, entitled "Segmented Parallel Rail Paths for Input/Ouptut Signals" granted Feb. 3, 1976 to D. T. Cox, et al.; "Hardware Implementation of a Small System in Programmable Logic Arrays", by J. C. Logue, et al.; IBM Journal of Research and Development, March 1975, pages 110 through 119; "Introduction to Array Logic " by H. Fleisher and et al.; IBM Journal of Research and Development, March 1975, pages 98 through 109; the article entitled "Array Logic Macros" by J. W. Jones, IBM Journal of Research and Development, March 1975, pages 120 through 125; U.S. patent application Ser. No. 534,944, U.S. Pat. No. 3,987,286, entitled "Time Split Array Logic Element and Method of Operation", filed Dec. 20, 1974, by E. I. Muehldorf and of common assignee herewith; and U.S. patent application Ser. No. 480,794, entitled "Improved Read/Write Array" by R. I. Spadavecchia and J. R. Struk and of common assignee herewith.

The logic and array configuration of such a system is characterized by having a single-sided delay dependency. It is organized such that correct operation of the system does not depend on rise time, fall time, or minimum delay of any individual logical circuit or the array. The delay depends on how many levels or stages of logic including the array through which a signal travels from one clocked element, i.e., from one latch to another one, without depending on the individual circuit delays along this path. Such a configuration is known as level sensitive.

For purposes of definition a logic system is level sensitive if (and only if) the state response to any allowed input state change is independent of the circuit and wire delays within the logic/array system. Also, if an input stage change involves the changing of more than one input signal, (that is, a multiple input change) then the response must be independent of the order in which the multiple input change occurs, with respect to the ordering of the inputs.

The above definition of the level sensitive operation introduces the constraint that only allowed input changes may occur. These constraints apply primarily to the system clocking signals. However, this necessitates that outside data signals applied to a level sensitive circuit must be sampled and synchronized to the clock trains.

The term steady state response refers to the final value of all internal storage elements such as latches, flip-flops or other structures characterized by feedback loops. A level sensitive system is assured to operate as a result of sequences of input signals meeting the proper constraints and by providing a sufficient lapse of time between changes, such that the system will stabilize in a new internal state. This time lapse is generally assured by means of the system clock signal trains that control the operation of the logic and array configuration. In addition, a sufficient time lapse may be required between applying the clock trains and array control signals such as the read and write control signals, or array clocks should the array require separate clocks.

The logic organization of such a system incorporates the additional concept that all internal storage elements may function as elements of a plurality of shift registers having access and controls independent of system access and control. In order to implement this concept, all storage within the logic organization, which may not be arranged into an array or be part of an array, is accomplished by latches that are free of race or hazard conditions thus obtaining logic/array systems that can be made insensitive to any AC characteristics. These latches are also level sensitive. This concept rules out complex, multiple feedback storage elements of the type such as described, for example, in "Switching circuits for Engineers," by M. P. Marcus, Prentice-Hall, (Copyright 1962, 1967) in the chapters 13–19, pages 182–300. In utilizing latches that can be organized in a shift register configuration, the scan-in/scan-out capability is realized.

The system is driven by two or more non-overlapping clock signal trains that are synchronized with each other. Each of the clock pulses in a train need only have a length of sufficient duration to set a latch. The gating signal and the excitation signal for any of the clocked latches are a combinatorial logic function of the system input signals, the output signals from latches controlled by one of the clock signal trains other than the train providing an input to such a clocked latch, or from an array.

One way of accomplishing this latter objective is to have each clocked latch controlled by exactly one of the system clock signals. When the gating signal and the clock signal are both of such a logic value, that the logic AND-connective of both yields a logically true value or a ONE, the clocked latch is set to the state determined by the excitation signal for that latch.

Figure 1:
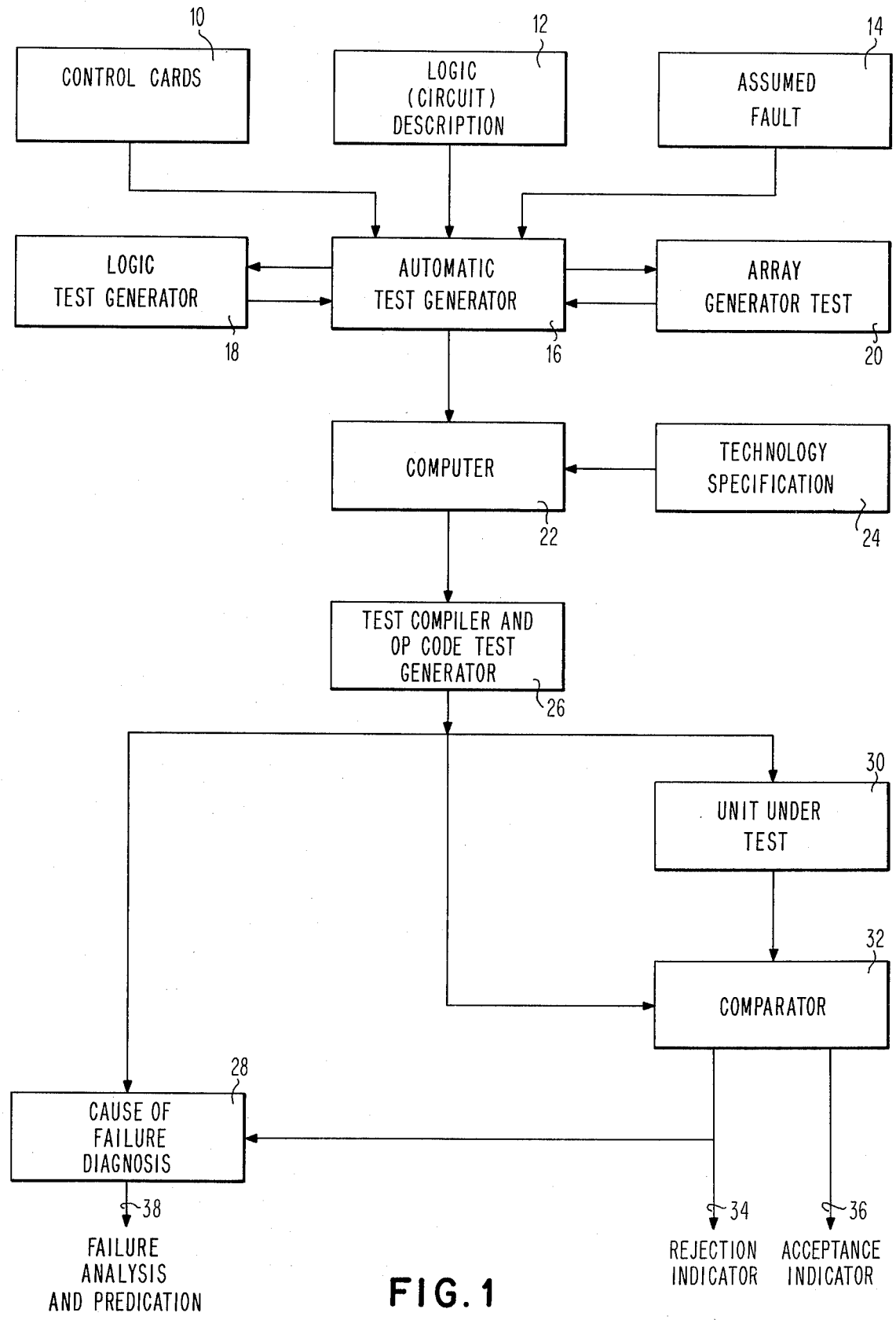
FIG. 1: Block diagram of a testing system for carrying out test according to method of invention.

With a logic system organization according to these requirements, test patterns provided by an automatic test generator are supplied for accomplishing the propagation delay testing of the logic system according to the method of the invention. The system is depicted in FIG. 1. Test patterns are provided to a unit under test 30. Such a unit is formed using the fabrication methods of LSI. It may be the lowest level of unit of integration such as a semiconductor chip having thousands of circuits contained within it or it may be a larger modular unit containing tens of thousands of such circuits. In all instances the unit satisfies the requirements of single-sided delay dependency and it has a scan-in/scan-out capability. A more complete description of such an organization is described more particularly hereinafter.

The test patterns supplied to the unit under test 30 include both stimuli and responses expected from the particular unit when acted upon by the stimuli, in a fashion that each specific response is correspondent to a specific stimulus. These patterns are generated by an automatic test generation system which is included as a part of a general purpose digital computing system such as, for example, a System 360 Model 65 or Model 85. Such a system would include a backup storage of one megabyte.

The organization shown in FIG. 1 includes an automatic test pattern generator 16, with a logic test generator 18 and an array test generator 20, since the properties of the logic may be sufficiently different than the ones of the array. The array test specification may include requirements to test for the regular structure as well as for the timing properties resulting from a specific implementation in a specific technology. The logic, on the other hand, is generally a free formed irregular physical arrangement which is subject to quite different delay properties than the array. Both generators must work cooperatively in order to properly determine tests for paths that contain logic and array elements, as described more particularly hereinafter.

The automatic test generator has an assumed fault library 14 stored within it. It also includes control cards 10 including all parameters necessary for generating the test patterns. The control cards 10 contain the procedures for operation and determine what routines and subroutines must be employed for accomplishing the testing of the particular unit under test 30. The assumed faults 14 can be either a list compiled from the circuit diagram or an algorithm for each type of circuit arrangement or network that may be tested.

In order to determine the particular patterns to be generated and the paths to be sensitized, the logic (circuit) description 12 of the particular unit under test 30 is provided to the automatic test generator 16. The logic (circuit) description 12 consists of the logic as well as physical design particulars of the unit under test 30 and is employed as a basis for determining the particular test and the possible failures that may occur. The automatic test generator 16 provides the logic patterns for the selected paths of the unit under test 30. These logic patterns are provided to a compiler 22, which also accepts the technology specifications 24 for the particular unit under test. These specifications 24 consist of the values of voltages and currents expressing the binary ONES and ZEROS of the logic pattern. Hence the compiler 22 provides test patterns of binary ONES and ZEROS in terms of technology specific voltages and currents to the test compiler 26. Compiler 26 now adds the test apparatus operation codes and arranges the patterns in a format suitable for application to the unit under test 30.

The test patterns contain both the stimuli as well as the expected responses. Using the method of the invention the patterns are applied to the unit under test 30, and the response as well as the expected response are compared in comparator 32. The comparator provides an indication of rejection 34 or acceptance 36. The rejection indication 34 may also be supplied to a cause of failure diagnosis unit 28, which also receives from the test compiler test data to predict failure operation. This diagnostic branch of the test system is employed to perform diagnostic type of testing. Its output is a failure analysis and predictor 38.

The apparatus and program controls required for generating test patterns as well as for selecting and sensitizing paths through the circuit and array combination are similar to the established techniques which are employed for generating fault oriented DC tests which are well known in the art. For example, programs necessary to develop the test patterns for a logic circuit are described in a paper entitled "Algorithms For Detection Of Faults In Logic Circuits" by Bourcius, et al., which was published as Research Report RC3117 by the IBM Thomas J. Watson Research Center on Oct. 19, 1970. An algorithm for the computation of tests for failures is described in "Diagnosis of Automatic Failures: A Calculus and a Method" by J. Paul Roth, in the IBM Journal of Research and Development, July 1966. These papers and reports describe how to develop programmed algorithms for test generation and evaluation, and they include generation of assumed fault data necessary for automatic test pattern generation.

The generation of delay propagation tests for this invention is similar in difficulty to generating a combinatorial DC test. Each AC test is described by a combinatorial function rather than a sequential function. Thus, each possible AC test is determined by one of the $2^m$ combinations of $m$ binary values of the system inputs of the functional logic unit and the internal inputs from the sequential logic circuits on the unit. It is to be recognized that the invention of this application does not reside in the generation of test patterns for the unit under test nor does it reside in selecting the paths to be sensitized, but rather it is directed to the method of testing the unit when the patterns are applied to selected sensitized paths.

In order to accomplish the testing of the logic/array unit as per the method of this invention the requirements of single-sided delay dependency and scan-in/scan-out capabilities must be met for the unit. The generalized logic organization of such a unit is shown in FIG. 2. The configuration is formed of a plurality of logic combinatorial networks 42, 44 and array circuitry 40, arranged in such a fashion that the array is embedded within the combinatorial logic. The logic/array combination 40, 42, 44 is connected to a set of pluralities of input latches 46, 50, 54, where the illustration indicates that a plurality of input latches 46 may connect to combinatorial logic 42 via the plurality of paths 74, another plurality of input latches 50 may connect to the array 40 via the plurality of lines 76 and the plurality of latches 54 may connect to the combinatorial logic 44 via the plurality of lines 78. There is also a plurality of output latches 58, 62, 66, of which the set 66 is fed from the combinatorial logic 42 via the plurality of lines 86, furthermore, the set 62 is fed from the array 40 via the plurality of lines 84, and finally the latch set 58 is fed from the combinatorial logic 44 via the lines 90. Each of the output latches in sets 58, 62, 66, is preceded by an AND gate; thus the plurality of latches in 58 is preceded by the plurality of AND gates 60, the plurality of latches 62 is preceded by the plurality of AND gates 64 and the latch set 66 is preceded by the plurality of AND gates 68.

Effectively then, the logic system is partitioned into a plurality of parts, each of which is composed of a set of combinatorial networks, embedded between which is array circuitry, and sets of latches which can all be considered subsets of a bigger set. Although one such organization is shown, it is to be understood the many such organizations may be arranged in parallel in accordance with the substance of this invention. The system also contains a plurality of direct inputs 71, which is distributed via a plurality of lines 70, 79, 81, 83 to the combinatorial logic 42, 44 and the array 40. Furthermore, the system contains a plurality of direct outputs 79, to which are connected the plurality of lines 72, 73, 75 77 transporting outputs data from the combinatorial logic 42, 44 and the array 40.

Each of the combinatorial networks 42 and 44 is a multiple input multiple output network of several stages of combinatorial logic. The array 40 is embedded in the combinatorial logic by plurality of connecting lines 80 feeding the array from logic 42 and by the plurality of connecting lines 82 feeding the logic 44 from the array. The logic 42 and 44 are also connected via a plurality of lines 88. The combinatorial logic and the array thus forms a unit, which responds to any unique input combination of signals to provide a unique combination of output signals. The input signal set may be external signals or signals from the input latches 46, 50, 54. It is also understood that the term set may means a single item or a substantial plurality of such items.

A requirement to render the generalized structure capable of being tested according to the method of the invention is that the latch set controlled by one clock signal cannot be connected through the combinatorial logic and array structure to other latches that are controlled by the same clock train. Thus, outputs from latch set 46 cannot be connected back to the input of latch set 46. However, data emanating from this latch set 46 via lines 74 can via many paths be coupled to latch sets 58, 62, 66 each of which must be gated by a different clock train than latch set 46 which is not overlapping in time.

This requirement can be met by providing clock trains C11, C12, C13, C21, C22, C23 as shown in FIG. 3. There are a plurality of clock trains in clock train set #1 of which only C11, C12 and C13 are shown, which gate data into the input latch sets 46, 50, 54 via the AND gate sets 48, 52, 56 each such set representing a plurality of AND gates. This set #1 of clock trains may occupy a periodically repeated time segment T1 as shown in FIG. 3. Another clock train set, shown as clock train set #2, includes a plurality of clock trains of which only C21, C22, C23 as shown in the figure, are used to gate any signal emanating from the logic/array structure through the plurality of AND gates 60, 64, 68. The clock train set #2 occurs in the periodically repeated time segments T2, as shown in FIG. 3. Time segments T1 and T2 must not overlap for the logic system to work according to the invention.

The clock signals entering the plurality of AND gates shown as sets 48, 52, 56, 60, 64, 68 must be at a logic state of ONE when the respective data signal is present for the state of the latch to assume the value of the data signal entering the AND gate. Thus, if a signal on line 95 is ONE at the same time the clock C11 is ONE, the corresponding latch of latch set 46 will produce the signal state ONE at its output, and if the signal on line 95 is ZERO at the same time the clock C11 is ONE, the corresponding latch of latch set 46 will produce the state ZERO at its output. The latches of latch set 46 may be either set/reset latches, more particularly described hereinafter, in which case the actuality a pair, one AND gate for the set and one for the reset input, more particularly described hereinafter. The latches of latch set 46 may also be data latches of the type described in U.S. Pat. No. 3,761,695, "Method of Level Sensitive Testing A Functional Logic System" by E. B. Eichelberger. It should be understood that the logic organization of FIG. 2 functions with either type of latch. With either type of latch, the system clocking scheme (clocks C11, C12, C13, C21, C22, C23) as shown in FIG. 3 will assure that the logic/array is fed by latches clocked by clock trains that are different from the clock trains actuating the latches that the logic/array feeds. Feedbacks within this organization are only permissible between latch sets 58, 62, 66 to latch sets 46, 50, 54, which are shown connected by plurality of lines 51, 53, 55 to a plurality of feedback lines 92, which can then branch into pluralities of lines 95, 97, 99 feeding the latches 46, 50, 54.

When the clock signals from clock train set #1 are at the logical ONE level, they permit propagation of signals through the plurality of AND gates 48, 52, 56 and thus entry of signals into the plurality of input latches in sets 46, 50, 54 and the establishing of the logic signal values at the latch outputs. These clock signals thus must be of sufficient duration at the ONE level to permit setting of the latches during the time interval at which they are at the logic ONE level. The logic signals now emanating from the plurality of latch sets 46, 50, 54 act upon the logic/array combination 42, 40, 44 and propagate through it. Once the logic levels at lines 84, 86, 90 have settled to their value determined by the values at the input latch sets, the clock train set #2 may clock the signals through the plurality of AND gates 60, 64, 68 into the output latch set 58, 62, 66. Again the time interval at which the signals of clock train set #2 are at the logical ONE level must be of sufficient duration to accomplish the appropriate setting of the latch sets 58, 62, 66. The time difference between the trailing edge of the last clock pulse in clock train set #1 and the leading edge of the first clock pulse in clock train set #2 must be of sufficient duration to permit propagation of the signals through the logic/array combination and settling of the signals at the plurality of AND gates 60, 64, 68 to a steady state. For some designs, it may be sufficient to have a clock train set #1 comprising only a single clock C11 and clock train set #2 comprising only a single clock C12. Such operation meets the requirement for level sensitive operation and assures a minimum dependency on AC circuit parameters. As will be discussed more fully hereinafter, it is the set of these paths through the combinatorial logic/array combination and the latch sets that are tested for delay propagation according to the method of the invention.

Logic information flows into the level sensitive logic system through the plurality of inputs 71 shown in FIG. 2. These inputs interact within the logic system and they must be synchronized to the clock trains for proper interaction. For example, the input signals applied to the plurality of AND gate 48 must be stable during the time that clock train C11 is at the logic ONE level, while inputs acting upon the logic/array combination 40, 42, 44 must lead to stable outputs from this combination during the time the clock signals in clock train set #2 are at the logic ONE level. If the external signals are asynchronous with respect to the clock train sets #1 and #2, then they must be synchronized. This can be accomplished by using latches, that receive as inputs one of the excitation signals as well as the particular clock signal. Since the latch cannot change its state when the clock is in the logic ZERO state, the output of the latch only changes during the period when the clock signal is in the logic ONE condition. Even when the input signals change during the time when the clock signal is in the logic ONE state, no operational problem occurs, provided the input signals remain at their new values for a clock cycle. The latches will then change states at the next clock signal.

This system obviously can only accept inputs that change less frequently than the fundamental clock cycle. This is no fundamental difficulty, since every system does have a response time. The response time of logic organized in the manner of the level sensitive scan arrangement is the basic cycle of clock train sets #1 and #2. External outputs emanating from this organization are also synchronous with respect to the clock trains. This does not represent any problem in machine organization. Should they interfere, because a part of the machine may be requiring different clocks, resynchronization to the different clock can be carried out in the manner described above.

The array 40 in FIG. 2 is an $m \times n$ array of elements which can be considered as data storage cells. Since this requires a memory capability, the array is, strictly speaking, not combinatorial logic. However, its regularity makes it possible to embed it within the logic and still retain the characteristics of the logic structure that make it possible to perform testing in the manner of the invention. Details about the array are shown in FIG. 5. There is the plurality of $m \times n$ storage elements 140, which has a data input DA and may also have an optional array clock input CA. The matrix is preceded by an address decoder 142 with the input A. An address is read through A into the decoder, which then sensitizes an address in the array for reading data out of, or writing data into, the selected address of the array. An optional output buffer 144 may provide appropriate signal timing for the signal readout of the array through the plurality of output lines O, which correspond to 82, 84 of FIG. 2. In addition, there is a read-write control line 94 which must be accessible from a primary input to the structure. If the write mode is established, the data at the array inputs DA will be stored in the address determined by decoder 142. If the read mode is established, the data stored in the address determined by the decoder 142 is is presented to the array outputs O. The signals from O (82, 84) will propagate through the logic network 44 of FIG. 2.

In case that the array does have the optional array clock, the latter must be synchronized with the clock train sets #1 and #2 of the logic organization of FIG. 2. The signals emanating from the latch sets 46, 50, 54 will at some point in time be received by the array. The array clock must now be timed such as to properly receive these signals and insure the proper function of the array. The optional output buffer 144 must again be timed such, that their outputs reach stability in sufficient time before the signals in clock train set #2 are at the logical ONE level, such as to permit propagation through the combinational logic 44 before clocking the data into the plurality of latch sets 58 via ANDs 60. Simultaneously, the condition must be met, that the signals at the plurality of lines 84 is stable in a fashion such that they can be clocked by C22 through the plurality of ANDs 64 into the plurality of latches 62.

A logic system containing embedded arrays as shown in FIG. 2 with the clocking described above has a single-sided delay dependency. This is one of the capabilities required for carrying out the test method of the invention. The other condition is the scan-in /scan-out capability, which is provided by the chaining of all pluralities of latch sets 46, 50, 54, 58, 62, 66 into one or more shift registers. The configuration in FIG. 2 shows the chaining of the plurality of latch sets into one shift register, whereby it is to be understood that several such shift registers can be connected. The conditions for each shift register are the same as the conditions for one shift register described more particularly hereinafter. This is accomplished by providing each latch in each latch set with scan-in clocks CS1 and CS2. The scan-in clocks must have at least two clock trains as shown in FIG. 4. They must be interspersed and non-overlapping, i.e., whenever CS1 is in the logic ONE state CS2 must be in the logic ZERO state and vice-versa. This is the normal manner in which a shift register is organized. The shift register is connected via the plurality of lines 67 not necessarily in the order shown here, but such that one input latch (member of sets 46, 50, 51) is either followed by an output latch (member of sets 58, 62, 66) or an auxiliary latch, such that the shift register does have two latches per bit position, and the one later is a member of the input set. This configuration possesses a scan-in input 65 and a scan-out output 69, which must be connected directly to the terminals of the LSI package, i.e., they must be accessible independently of the other circuits in the logic organization and regardless of the logic function of the organization shown in FIG. 2. They may be a primary logic input and output if the logic function dictates such an input and output.

In order to utilize the method of the invention, it is necessary that the general logic system have the ability to monitor dynamically the state of all internal storage elements. This is accomplished by the chaining into shift registers of the plurality of latch sets. This requirement of the logic organization permits testing according to the method of the invention. This ability eliminates the need for special test, it simplifies all phases of manual debugging and it provides a standard interface for operator and maintenance consoles. In order to achieve this ability, there is provided with each latch in each latch set of the system, circuitry to allow the latch to operate as one position of a shift register with shift controls independent of the system input/output. This configuration is referred to as a shift register latch and will be described more particularly hereinafter. All these shift register latches within a given chip, module, etc. are interconnected into one or more shift registers. Each of these shift registers has an input and output shift control available at the terminals of the package. By converting the clocked DC latches into shift register latches the logic configuration of FIG. 2 acquires the advantageous property that all clocks can be stopped and a diagnostic analysis is possible independently of the specific function of the logic. For this purpose the diagnostic data sequences can be shifted into and out of the latches. This capability is referred to as scan-in/scan-out or log-in/log-out.

In the test method of the invention propagation delay testing is performed on sensitized paths through a combinatorial circuit/array network with the sequential networks reduced effectively to combinatorial networks. Scan-in/scan-out provides the necessary capability for accurately diagnosing both design errors and hardware failures for system bring-up, final system test and field diagnostics. The shift registers are also usable for system function such as console interface and system reset.

As is well known in the art, the problem of automatically generating test patterns as described in connection with FIG. 1 for combinatorial logic networks is relatively simpler than the generation of test patterns for sequential logic circuits. Accordingly, it is necessary to reduce sequential logic circuits of the generalized logic to sequential form. This is accomplished by the additional circuitry for selectively converting the DC latches in shift registers providing the capability for scan-in/scan-out.

Figure 6:
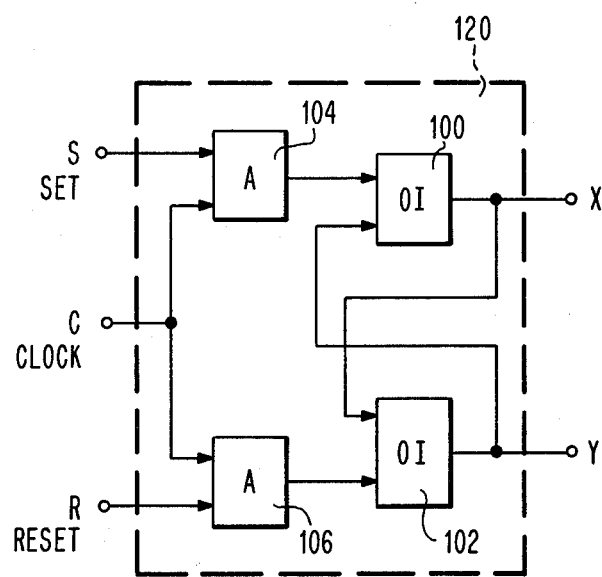
FIG. 6 Diagram of a latch suitable for the system using FET embodiment.

The basic configuration of a latch as it might be implemented in the field effect transistor (FET) technology is shown in FIG. 6. The latch 120 consists of two OR-INVERT (also commonly called NOR) circuits 100 and 102, connected as shown. The output of circuit 102 feeds back to circuit 100 and vice-versa. This produces the well known latch effect. Each of the circuits 100 and 102 have one additional input respectively, fed by AND gates 104 and 106. Both AND gates receive a clock input C as well as respectively, a set(s) and a reset (R) input. When S is a logic ONE then the output Y will be set to a logic ONE at the time that the clock C will be a logic ONE. Concurrently the output X will be set to a logic ZERO. Once output Y has assumed the value logic ONE, this value is retained until the latch is reset. The reset action is accomplished by bringing a signal at the logic ONE level to the input R. When this is the case and the clock C assumes the value logic ONE, the output X is set to logic ONE, while conveniently the output Y is reset to logic ZERO. There should not be a situation where both the S and R input are simultaneously at a logic ONE while the clock C is at a logic ONE, because the latch may set either of the outputs X or Y to ONE. This can be avoided by designing a set or reset dominant latch, which by design will always set either X or Y to logic ONE even if both inputs S and R are at logic one while the clock C is at logic ONE. A SET dominant latch is created out of the circuit shown in FIG. 6 by deliberately designing the delay along the feedback path from circuit 100 to 102 to be larger than the delay in the feedback path from circuit 102 to 100 under all conditions dictated by the design tolerances, such that the circuit will go to the set state for all circumstances where S is at the logic ONE level and the clock C is also at the logic ONE level.

Figure 7:
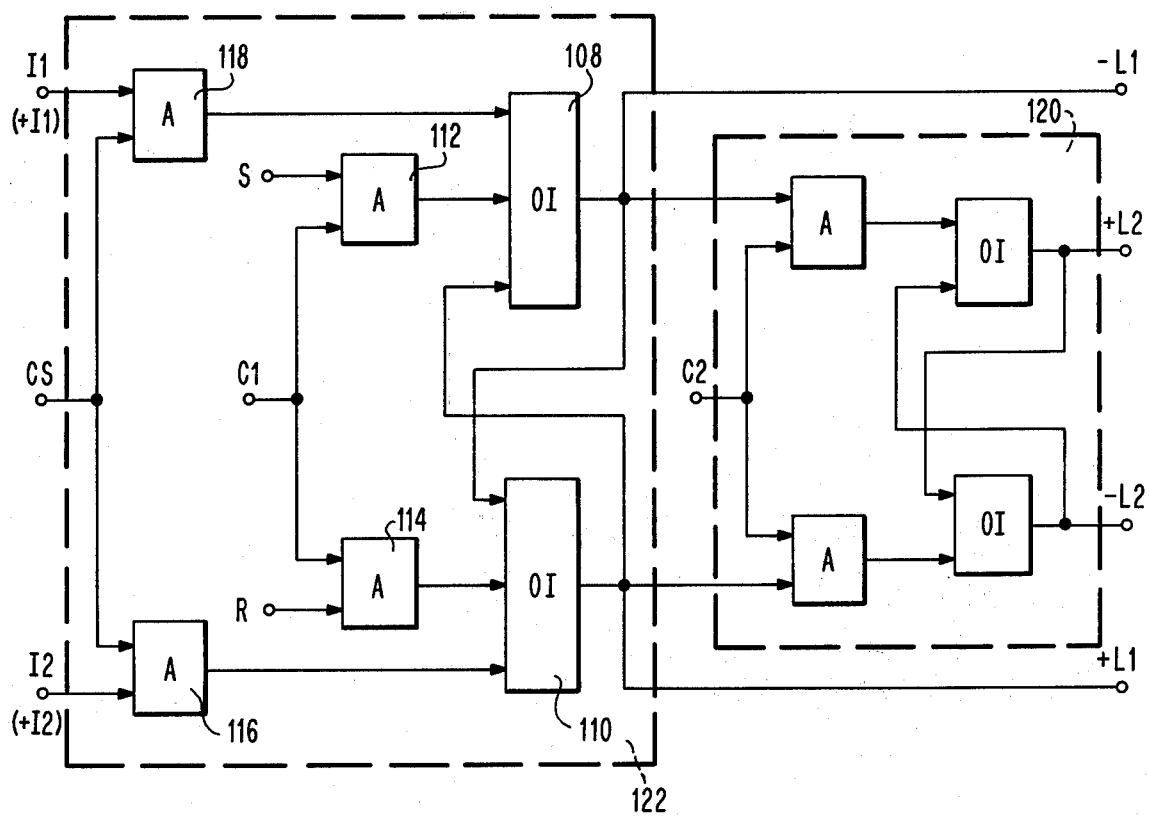
FIG. 7: Diagram of latch pair of system/auxiliary latch for the general organization, suitable for FET embodiment.

The basic latch shown in FIG. 6 is used as an element in the shift register latch which is shown in FIG. 7. The latch 120 is clearly recognizable. The clock input is C2. Its S and R inputs are connected to the output of another latch 122, which consists of the two OR-INVERT circuits 108 and 110, connected by a feedback arrangement in the manner described more fully for the latch 120 as shown in FIG. 6. The OR-INVERT circuits 108 and 110 have two additional inputs each. One input pair is fed by a pair of AND gates 112 and 114 which admits the clock C1 and the set and reset inputs S and R respectively. The inputs S and R serve as the data inputs for this latch. The other input pair is fed from a second pair of AND gates admitting another set of inputs I1 and I2 clocked by a clock Cs which is one of the scan clock trains shown in FIG. 4 and discussed earlier herein. The inputs I1 and I2 serve as shift register inputs for this latch. By connecting the latch via I1 and I2 to outputs +L2 −L2 of another latch, the shift register for the scan-in/scan-out operation is created. The I1, I2 inputs are independent from the system inputs S and R because each set of inputs is clocked by the different clock trains Cs and C1, respectively.

The symbolic representation of the shift register latch is shown in FIG. 8. The input latch 122 has the system inputs S and R and is clocked via the system clock C1. This clock must be a member of the clock trains C11, C12 . . . etc. as shown previously in FIG. 3. The inputs +I1 and −I1 are clocked by the shift register clock CS. This clock must be a member of the register (Scan-In) clock trains, as shown previously in FIG. 4. Since latch 122 is clocked by a system clock of the C1 train (C11, C12 or C12, as shown in FIG. 3), the scan clock must be CS1. For the shift register latch configuration shown in FIG. 8, the clock train CS1 can coincide in time with a clock of the clock trains C11, C12 . . . etc. However, the logic system must allow for the possibility to actuate either CS1 or one of the trains C11, C12 . . . etc. independently.

The latch 122 is connected via its outputs +L1 −L1 to the R and S inputs of latch 120. This latch is clocked by the clock C2, which can be the train CS2 as shown in FIG. 4 or one of the trains C21, C22, etc. shown in FIG. 3. In the connection shown in FIG. 8, the clock train CS may advantageously be chosen to be identical with members of the clock train C11, C12 . . . etc; this will be true under the assumption that each latch consists of a pair 122-120, and the system information passes through both of them, as discussed more fully hereafter.

When comparing FIG. 2 to FIG. 8 it can be stated that the latch sets 46, 50, 54, 58, 62, 64 must be of the type 122 in order to permit independent clocking of logic system signals and shift register information. If each latch set 46, 50, 54, 58, 62, 64 is of type 122 only, then the shift register must be organized in a special fashion. The organization must be such, that one latch from the input latch sets 46, 50, 54 is followed by one latch of the output latch sets 58, 62, 66. This is necessary, because a shift register needs two latches for each bit of information, that is, each adjacent two latches do contain the same information. In this fashion, a test pattern may be loaded into latches belonging to the plurality of sets 46, 50, 54, while the result of the test will be captured in latches belonging to the sets 58, 62, 66. The method of testing will be more fully described hereinafter. Thus, a system structure can be constructed by having single latches of the type 122 shown in FIG. 7 of this application for each of the latches in the set. This organization requires that there are the same number of input and output latches, i.e., the total number of latches in sets 46, 50, 54 equal the number of latches in sets 58, 62, 66.

However, the system can also be organized in a fashion described in FIG. 7 of U.S. Pat. No. 3,783,254, fully identified, that uses a latch of the type 122 followed by a latch of the type 120. Thus, every system latch will have the two stages necessary to form a shift register such that a test pattern can be loaded into it. The two latches will be physically closely together and not require long wires for connecting the shift register configuration. In this case, all system inputs and outputs (lines 95, 97, 99, 90, 84, 86) are feeding into latches of the type 122. Each such latch is followed by a latch 120 which is used for the shift register operation. All latches fed by input lines 95, 97, 99 are clocked by one system clock which is a member of the plurality C11, C12, C13, etc., as shown in FIG. 3, while output lines 84, 86, 90 are clocked by C21, C22, C23, etc. The shift clock for the input latch is a clock of the type CS1 as shown in FIG. 4, which may be coinciding in time with one of the clocks C11, C12, C13, but must be logically independent thereof. The second latch of the type 120 (as shown in FIG. 8) is an auxiliary latch and is clocked by the shift clock CS2. Feedbacks to the logic/array combination (lines 79, 81, 83 in FIG. 2) must emanate from output latches with the clocking C21, C22, C23 described above. This type of operation does guarantee race free operation and single-sided delay dependency. It should be noted that the system could also be organized in the fashion shown in FIG. 12 of U.S. Pat. No. 3,783,254, fully described.

Figure 9:
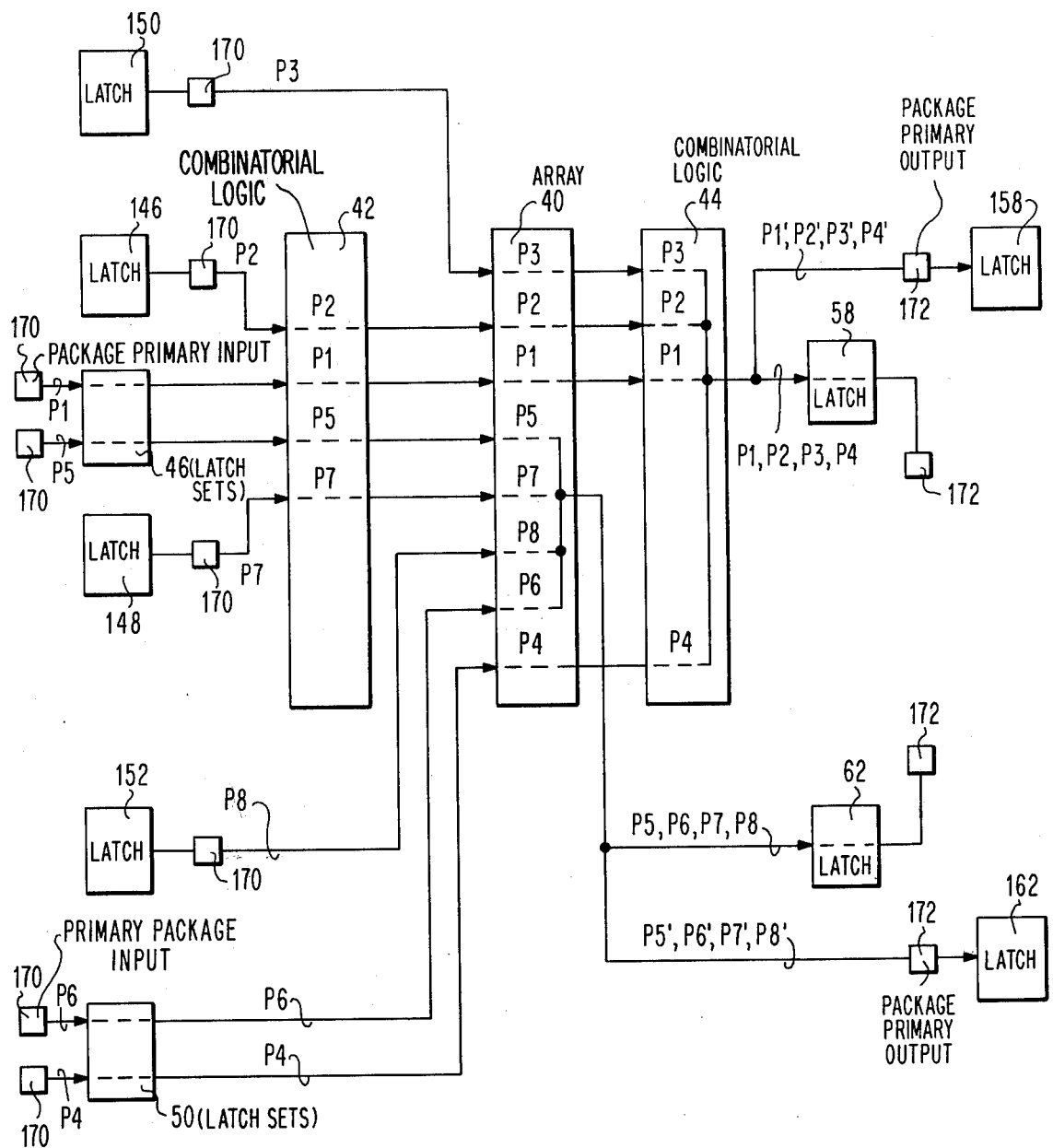
FIG. 9: Illustration of paths through the system.

With the system configuration as shown in FIG. 2 a set of different classes of delay sensitive paths may exist. FIG. 9 serves as illustration of these paths. The first class of paths is P1, which starts at a package primary input 170 and connects to a system latch being a member of the plurality of latch sets 46. The path then progresses through the latch, into the combinatorial logic 42, through the combinatorial logic 42 to the array 40, through the array 40 into the combinatorial logic 44, through the combinatorial logic 44 into a system latch being a member of the plurality of latches 58, through the latch and terminates in a package primary output 172. A secondary branch of this class of path P1' does not go through the latch, but instead terminates after the logic in a package primary output 172. It may connect optionally to a latch 158, which is a member of a plurality of latches contained in the testing apparatus, and serving as a capture mechanism for the results of an AC test through path P1'. A similar arrangement may also serve as capture mechanism for other paths as described more fully hereinafter.

The second class of paths is P2, which starts at a package primary input 170. It may be preceded by an auxiliary latch 146, which is part of the testing apparatus and may serve to regulate the timing of the signal appearing at the package terminal 170. The signal path connects to the combinatorial logic 42, goes through the combinatorial logic, connects to the array 40, passes through the array, connects to the combinatorial logic 44, passes through the combinatorial logic and connects to one out of the plurality of output latches 58. A second branch of the same path, P2' connects to a package primary output 172, which may connect to an auxiliary latch 158 as more particularly described above.

A third class of path P3 starts at a primary package terminal 170 which may be preceded by an auxiliary latch 150, connects to the array 40, proceeds through the array, connects to the combinatorial logic 44, and from there to one of the plurality of output latches 58 and hence to a primary package output 172. A second branch from this path P3' connects directly to a package primary output 172, which may be followed by an auxiliary latch 158.

A fourth type of path P4 starts a package primary input 170, passes through a system latch which is a member of the plurality of latches 50, connects to the array 40, passes through the array, connects to the combinatorial logic 44, passes through the logic and connects through the system latch which is a member of the plurality of latches 58 to a package primary output 172. A second branch of this path P4' connects from the logic 44 directly to a package primary output 172 which may be followed by an auxiliary latch being a member of the plurality of latches 158.

A fifth type of path P5 initiates at a package primary input 170, progresses to and through one of a plurality of systems latches 46 connects to the combinatorial logic 42, progresses through the logic, connects to the array 40, progresses through the array and to one of a plurality of system latches 62, through the latch and to a package primary terminal 172. A second branch of this type of path P5' connects from the array 40 directly to a package primary terminal 172 to which is connected one of a plurality of auxiliary latches 162, which is not a part of the LSI package but is contained in the testing apparatus. This auxiliary latch does have the function to capture the result of an AC test at a specified time thus providing exact timing of the test. The function of the plurality of latches 162 is comparable to the function of the plurality of latches 158, more fully described above.

Another type of path P6 starts at a package primary terminal 170, progresses through one of a plurality of system latches 50, from the latch to the array 40, through the array, to a one of a plurality of system latches 62 through the latch and to a package primary terminal 172. A second branch of this path P6' connects directly from the array 40 to a package primary terminal 172 which may be followed by an auxiliary latch being part of a plurality of latches 162 more particularly described above.

A seventh type of path P7 starts at a package primary terminal 170 and connects to the combinatorial logic 42. This path may be preceded by an auxiliary latch which is one of a plurality of latches 148, which is not part of the LSI package but an optional part of the testing apparatus, and which serves the purpose to accurately release in time a signal change as needed for performing an AC test. The path P7 proceeds through the combinatorial logic 42 connects to the array and proceeds through the array to a system latch which is one of a plurality of system latches 62. The path progresses through the latch and terminates in a package primary output 172. A second branch P7' of this path connects directly from the array to a package primary terminal 172 and may be followed by an auxiliary latch, which is one of a plurality of latches 162 more fully described above.

The eighth type of path P8 starts at a package primary terminal 170 which may be preceded by one of a plurality of auxiliary latches 152, the function of which compares to the function of auxiliary latches 146, 148, 150 more particularly described above. The path progresses to and through the array 40 and to one of a plurality of system latches 62, through the latch to a package primary terminal 172. A second branch P8' of this type of path connects directly to a package primary terminal 172 and may be followed by an auxiliary latch, which is one of a plurality of latches 162, more fully described above.

The paths P1 through P8 and P1' through P8' shown in FIG. 9 of the logic organization shown in FIG. 2 can be tested for AC faults according to the particular methods more fully described hereinafter. The first method of test is one of sensitizing a path for testing by an algorithm of the kind described either in "Diagnosis of Automatic Failure: A Calculus and a Method" by J. P. Roth in the IBM Journal of Research and Development, July 1966 or in the book "Fault Diagnosis of Digital Systems" by H. Chang, E. Manning and G. Metze, Wiley-Interscience, 1970, and changing an input and observing the output response after a specified interval in time. The second method of test requires shifting in a set of patterns into the system latches. At the instant in time when the pattern is applied to the combinatorial logic/array structure the primary inputs are also activated and the array, in case of an array timing requirement is properly activated. After a specified time interval the test result is captured in output latches and at package primary outputs and compared to a set of expected values. When the received pattern matches the expected values, the part may pass this particular test. The third method of test applies the patterns via the latches to the combinatorial logic/array and the capture takes place at an instant in time dictated by the speed at which the machine is expected to operate. In this fashion, the speed of the test may be varied from package to package for selecting parts according to operation speed. In addition the packages may be tested at a specified margin above the speed of application in order to guarantee a margin of safety.

Figure 10:
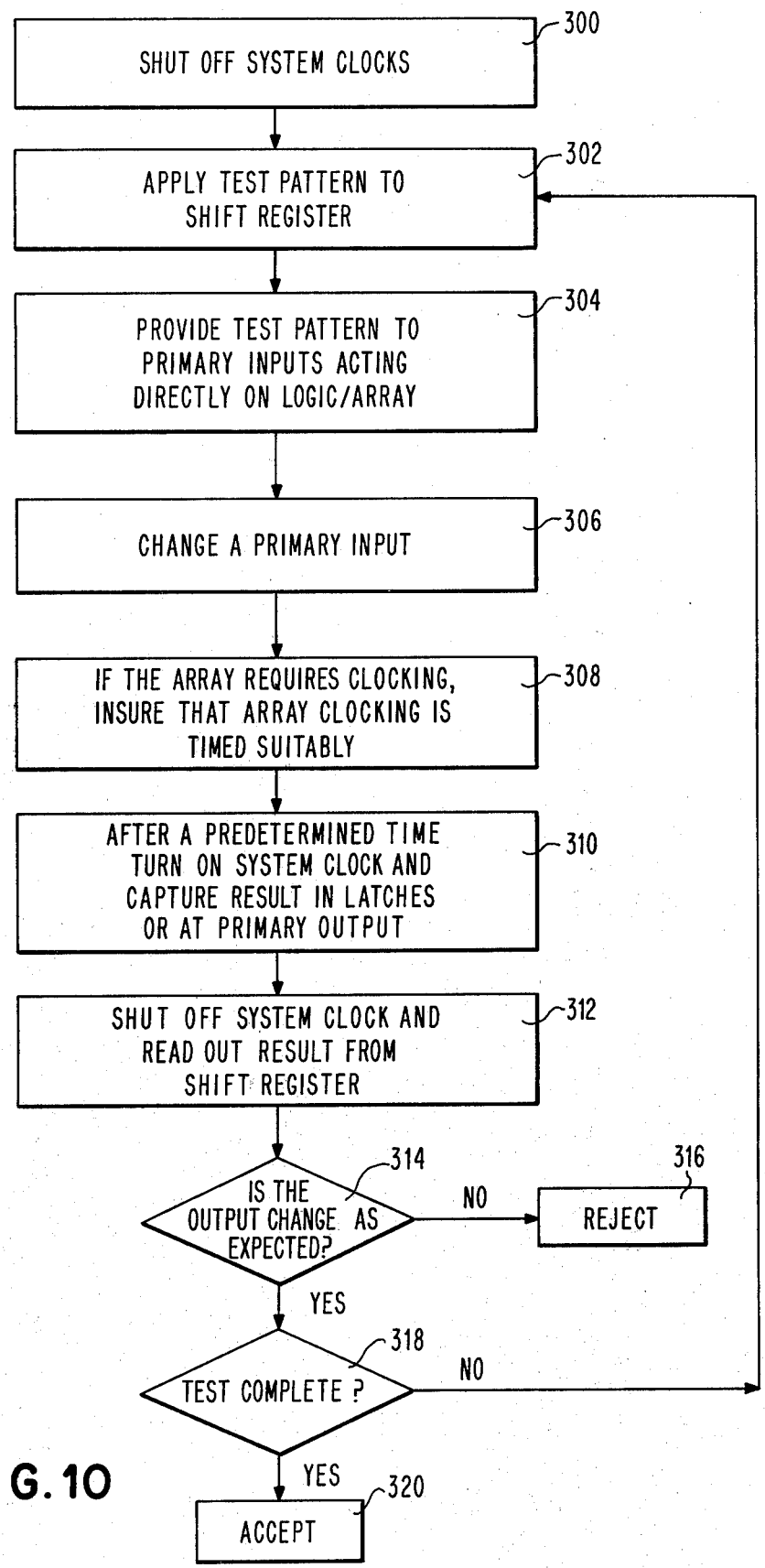
FIG. 10: Flow of test method, sensitizing and changing primary inputs.

A particular method of AC testing the logic and the embedded array is illustrated in FIG. 10, which shows a flow of actions for sensitizing the paths as described previously with reference to FIG. 9. The first step is to shut off the system clocks, as represented by block 300. A particular path is determined by the test generator 16 of FIG. 1, and the test pattern is scanned into the input latches 46, 50, 54 of shift register formed of the latch sets 46, 50, 54, 58, 62, 66 of FIG. 2 via the scan-in line 65 and the plurality of connecting lines 67 of FIG. 2 using the scan clocks CS1, CS2, as indicated by block 302 of FIG. 10. The effect of the shifting in the test pattern is to initialize the states of all (input) latches on the LSI package. Concurrent with the shifting-in process the other package primary inputs (170 in FIG. 9) are set to their initial values. This may be done by simultaneously shifting in the necessary patterns into the plurality of auxiliary latches 146, 148, 150, 152 of FIG. 9. After the circuit is completely initialized, the primary input is changed (as represented by block 306 of FIG. 10). Notice, that since the paths P1, P4, P5, P6 pass through a system latch on the package, and the package primary inputs to these latches may be only through the scan-in path input (65 on FIG. 2), a direct change of these paths may not be possible. This method, therefore, works primarily for paths P2, P3, P7 and P8, as well as P2', P3', P7' and P8'.

If the array requires clocking, the clocking must follow the change of the primary input by a prescribed interval to insure that the paths through the array 40 (FIGS. 2 and 9) are active, as represented by the block 308 in FIG. 10. After a predetermined time interval has elapsed, the system clock is turned on and the result of the test is captured at the outputs (represented by block 310) or the system output latches (58, 62 of FIGS. 2 and 9). The system clock is again shut off, as represented by block 312, and the result is shifted out of the shift register by the scan or shift clocks CS1 and CS2. The output is compared to the expected value (represented by block 314) and if it matches the test is continued, if no match is found, the package under test is rejected as indicated by block 316.

If the test is continued, a decision must be made as to whether the test is completed. As a practical matter, many hundreds and thousands of such tests to determine the propagation delay characteristics of the unit under test are carried out. These tests are listed, and the action indicated by block 318 carries out a comparison against this list. If all the tests are finished, the unit is accepted (represented by block 320) otherwise the tests are continued by cycling back to block 302. The acceptance (represented by block 320) indicates that the particular propagation delay characteristics set by the automatic test generation system have been met.

Figure 11:
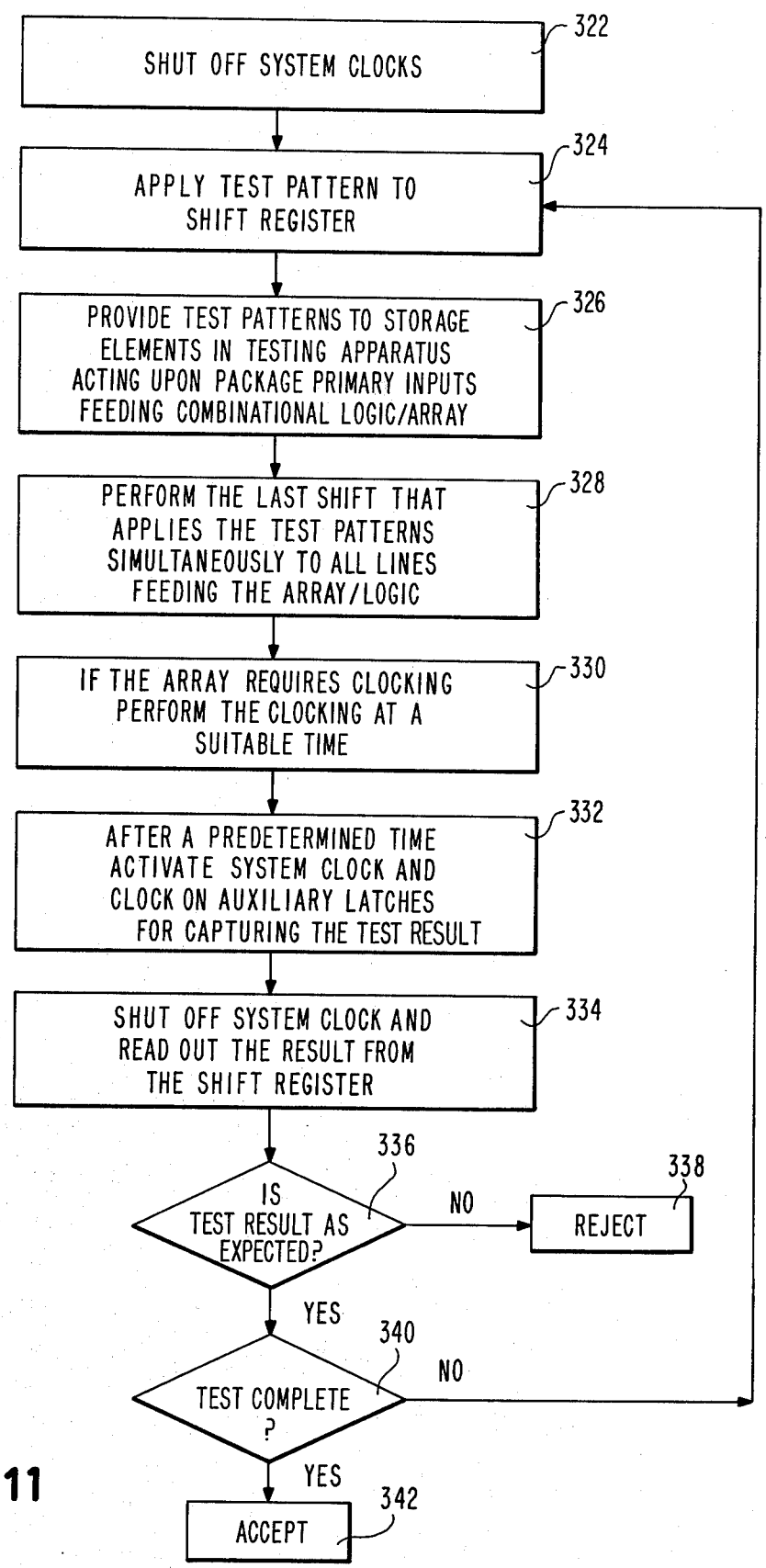
FIG. 11: Flow of test method, simultaneous sensitizing testing and machine speed testing.

The second method of testing expands on the first method of providing a method of applying simultaneous inputs to all lines feeding the logic array (74, 76, 79, 81, 83, 78 of FIG. 2) which sensitize the circuit as well as testing of one or more paths for their AC performance. The process is illustrated in FIG. 11. The test is started by turning off all system clock lines as represented by block 322. As the next step, represented by block 324, the test patterns are supplied to the shift registers. These registers can be assumed to consist of latches of the type 122 followed by latches of the type 120 as shown in FIG. 7. The latches of the type 120 could be considered as auxiliary storage cells for the bits, not acting on the logic; the logic would be connected to the +L1−L1 outputs of the latch 122. If it is not assumed that for each shift register stage a latch of the type 122 is followed by a latch of the type 120, but that all latches are of the type 122, with two separate system clock trains and two separate shift (scan-in) clocks (as in FIG. 4) are employed, the method described more fully hereinafter may be employed.

For the system latches consisting of latch configuration 122 followed by latch 120, the test patterns are loaded in such a fashion, that they are stored temporarily in the auxiliary latches 120. For the optional auxiliary latches 146, 148, 150, 152 of the testing apparatus it is also assumed that these consist of a double latch with a first one following a second one connected to the package primary input 170, and in which the test pattern is temporarily stored in the first latch. Thus, for all inputs connected directly to logic/array combination, there is a bit of the test pattern available in a latch just prior to the latch which actuates the logic/array combination. This step of the process is indicated by box 326 of the flow diagram FIG. 11.

Now a last shift operation is carried out by producing a logic ONE on the shift clock line at the latches immediately feeding the logic/array combination and then removing it. Thus, all paths of the type P1, P2, P3, P4, P5, P6, P7, P8 are now sensitized and simultaneously the tests are applied to these paths. The pattern is simultaneously applied to all paths, as indicated by block 328 of FIG. 11. If the array requires clocking, a suitable clock pulse is supplied to the array, as shown by box 330 in FIG. 11. After a predetermined time interval the test is captured in the LSI system latches (58, 62, 66 of FIGS. 2 and 9) and the auxiliary latches (158, 162 of FIG. 9), as represented by box 332 of FIG. 11. The system clock is then shut off (as represented by box 334) and the test result is shifted out for comparison. This comparison (as represented by box 336) may produce a coincidence with the expected result upon which the test is continued (as represented by box 340) or the part is rejected (as represented by box 338). If the test is continued, the completeness of the test is ascertained (as represented by box 340). If the test is not completed, another test pattern is loaded and the process is continued. If the test is finished, the part is accepted (as represented by box 342).

If the plurality of system latches (46, 50, etc.) do not consist of a double latch combination, then the test pattern is loaded in such a fashion that the simultaneity of application to the specified logic/array connection lines from the latches (74, 76, 78 of FIG. 2) and from the package primary inputs (79, 81, 83 of FIG. 2) is maintained. The optional latches 146, 148, 150, 152 of FIG. 9 can be used to advantage in this process by synchronizing the clocks in the testing apparatus and the package under test for these latches.

The third method of testing for safety margins and for machine speed use the flow shown in FIG. 11. For this method the application of system clocks for supplying the test to the logic/array combination and capturing the result of the test can be varied to insure that projected machine speeds are achieved. In addition, the freedom offered by the scan-in/scan-out capability can be used to supply the testing apparatus with designer developed test patterns in addition to the test patterns supplied by the test pattern generator 16 of FIG. 1.

The organization of FIG. 2 implies that restrictions are placed on the logic 42 and 44. In essence the logic 42 must be able to apply any arbitrary pattern to array 40 via the plurality of lines 80. Similarly, logic 44 must be able to perform a 1:1 mapping of the patterns received from the array via the plurality of lines 82 to the logic output which occurs on the plurality of lines 90, 77. The array clock and read/write lines 94 must be fed from package primary inputs.

The method described above is employed for testing propagation delays through sensitized paths involving the combinatorial logic/array combination. The delays of the latches are tested by applying minimum duration clock pulses of the clock train sets #1 and #2. In this manner, any path that can be exercised during normal operation of such a generalized logic system can be sensitized and exercised according to this method. The method involves the setting up of latch sets with predetermined patterns in the circuits of the sets. Thereafter, a primary input is altered. Dependent on the particular path, the alteration involves changing one of the primary inputs or one of the clock train inputs. Thereafter, following a predetermined period of elapsed time measurement is made for a change at the output of the sensitized path, either directly or by clocking and gating the signals into a latch set for observation. The method of the invention, therefore, provides a substantial indication as to the dynamic performance of a functional logic/array unit.

While the invention has been particularly shown and described with reference to preferred embodiments, it will be understood by those skilled in the art that the foregoing and other changes in form and detail may be made herein without departing from the spirit or scope of the invention.

What is claimed is:

1. A method of propagation delay testing a single-sided delay dependent level sensitive embedded array logic unit having primary inputs and primary outputs and formed of interconnected combinational network circuit means, array circuit means and sets of sequential circuit means having access for scanning independent of said primary inputs and outputs, said method including the steps of:
   a. selecting for test sensitization one path from a plurality of different paths, where each of said plurality of different paths extends from primary inputs of said single-sided delay dependent level sensitive embedded array logic unit to primary outputs of said unit;
   b. initializing the states of said sets of sequential circuits;
   c. applying a test pattern to at least some of said primary inputs for said selected path;

d. altering at least one of said primary inputs to the selected path;

e. monitoring the output of said selected path for a change of state after a given period of time has elapsed from the altering of the primary input, whereby an indication of the propagation delay through the selected path is obtained.

2. A method of propagation delay testing a single-sided delay dependent level sensitive embedded array logic unit as recited in claim 1 wherein one of said plurality of different paths is a path extending solely through said array circuit means.

3. A method of propagation delay testing a single-sided delay dependent level sensitive embedded array logic unit as recited in claim 1 wherein one of said plurality of different paths is a path extending solely through said combinational circuit means.

4. A method of propagation delay testing a single-sided delay dependent level sensitive embedded array logic unit as recited in claim 1, wherein said unit is a semiconductor chip having primary inputs and primary outputs and first combinational circuit means, array circuit means, second combinational circuit means and sets of shift register latch means intercoupling at least certain ones of said primary inputs and said primary outputs, where said method of claim 1 is successively practiced for at least each of the following paths: path No. 1 where path No. 1 is a path passing through said first combinational circuit means; path No. 2, where path No. 2 is a path passing through said array circuit means; path No. 3, where path No. 3 is a path passing through said second combinational circuit means; path No. 4, where path No. 4 is a path passing through said first combinational circuit means, said array circuit means, and said second combinational circuit means; path No. 5, where path No. 5 is a path passing through said first combinational circuit means and said array circuit means; path No. 6, where path No. 6 is a path passing through said first combinational circuit means and said second combinational circuit means; and path No. 7 where path No. 7 is a path passing through said array circuit means and said second circuit combinational means.

5. A method of propagation delay testing a single-sided delay dependent level sensitive embedded array logic unit as recited in claim 4, wherein at least certain of said paths commence at said shift register means and each said shift register means includes first and second controlled direct current latches.

6. A method of propagation delay testing a single-sided delay dependent level sensitive embedded array logic unit as recited in claim 4 wherein at least certain of said paths terminate at said shift register means and each said shift register means includes first and second controlled direct current latches.

7. A method of propagation delay testing a single-sided delay dependent level sensitive embedded array logic unit as recited in claim 1 wherein initialization of the states of said sets of sequential circuits is accomplished by scanning a predetermined signal pattern into said sets through said scanning access.

8. A method of propagation delay testing a single-sided delay dependent level sensitive embedded array logic unit as recited in claim 7, wherein the output of the selected path is a primary output of the unit and the monitoring is measuring performed directly by observing any change in primary output.

9. A method of propagation delay testing a single-sided delay dependent level sensitive embedded array logic unit as recited in claim 8, wherein the selected path commences at the primary inputs and passes through said combinational network means and said array circuit means and the direct measurement is made at a given time after effecting an alteration in one of the primary inputs.

10. A method of propagation delay testing a single-sided delay dependent level sensitive embedded array logic unit as recited in claim 8, wherein some of said primary inputs are clock trains coupled respectively to the sets of sequential circuits and the selected path commences in a set of sequential circuits and passes through said combinational network circuit means and said array circuit means and the direct measurement is made a given time after effecting a change in the clock train for the set where the path commences.

11. A method of propagation delay testing a single-sided delay dependent level sensitive embedded array logic unit as recited in claim 1 wherein the method of claim 1 is repeated a plurality of times, each time selecting a different one of said plurality of different paths.

12. A method of propagation delay testing a single-sided delay dependent level sensitive embedded array logic unit as recited in claim 11, wherein said array circuit means comprises an $m \times n$ read/write random access memory array having a capacity to store $m \times n$ binary bits of data.

13. A method of propagation delay testing a single-sided delay dependent level sensitive embedded array logic unit as recited in claim 11, wherein said array circuit means comprises a programmable logic array.

14. A method of propagation delay testing a single-sided delay dependent level sensitive embedded array logic unit as recited in claim 11, wherein said array circuit means comprises an addressable read only store means.

15. A method of propagation delay testing a single-sided delay dependent level sensitive embedded array logic unit as recited in claim 11, wherein some of said primary inputs are clock trains coupled respectively to the sets of sequential circuits and the output of the selected path is in one of the sets of said sequential circuits and the monitoring is performed by effecting a change in the clock train for the set having the output of said path and thereafter scanning out the contents of said set for obtaining an indication of a change in said set.

16. A method of propagation delay testing a single-sided delay dependent level sensitive embedded array logic unit as recited in claim 15, wherein the selected path commences at the primary inputs and passes through said combinational network circuit means and said array circuit means to said set of sequential circuits and the altering of the primary input occurs a predetermined period of time before a change is effected in the clock train.

17. A method of propagation delay testing a single-sided delay dependent level sensitive embedded array logic unit as recited in claim 15 wherein the selected path commences at one set of sequential circuits and passes through said combinational network circuit means and said array circuit means to the output of said path in another set of sequential circuits and the altering of the primary input is accomplished by changing the clock train for one set of circuits a predetermined period of time prior to the monitoring.

18. A method of propagation delay testing a single-sided delay dependent level sensitive embedded array logic unit, said logic unit comprising:
- a plurality of primary inputs;
- a plurality of primary outputs;
- first combinational logic circuit means having a first set of inputs, a second set of inputs, a first set of outputs, a second set of outputs, a third set of outputs, and a fourth set of outputs;
- array circuit means having a first set of inputs, a second set of inputs, a third set of inputs, a first set of outputs, a second set of outputs and a third set of outputs;
- second combinational logic circuit means having a first set of inputs, a second set of inputs, a third set of inputs, a fourth set of inputs, a first set of outputs, and a second set of outputs;
- first, second, third, fourth, fifth and sixth latch set circuit means, each of said latch circuit means having, first and second sets of inputs, and first and second sets of outputs;
- means connecting said second set of outputs of said first latch set circuit means to said fourth set of inputs of said second combinational circuit means;
- means connecting said second set of outputs of said second latch set circuit means to said first set of inputs of said array circuit means;
- means connecting said second set of outputs of said third latch set circuit means to said first set of inputs of said first combinational logic circuit means;
- means connecting said first set of outputs of said first combinational logic circuit means to said second set of inputs of said array circuit means;
- means connecting said first set of outputs of said array circuit means to said first set of inputs of said second combinational logic circuit means;
- means connecting said second set of outputs of said first combinational logic circuit means with said third set of inputs of said second combinational logic circuit means;
- means connecting said first set of outputs of said second combinational logic circuit means to said second set of inputs of said fourth latch set circuit means;
- means connecting said second set of outputs of said array circuit means to said second set of inputs of said fifth latch set circuit means;
- means connecting said third set of outputs of said first combinational logic circuit means to said second set of inputs of said sixth latch set circuit means;
- scan-in means connected to said first set of inputs of said first latch set circuit means;
- means connecting said first set of outputs of said first latch set circuit means to said first set of inputs of said second latch set circuit means;
- means connecting said first set of outputs of said second latch set circuit means to said first set of inputs of said third latch set circuit means;
- means connecting said first set of outputs of said third latch set circuit means to said first set of inputs of said fourth latch set circuit means;
- means connecting said first set of outputs of said fourth latch set circuit means with said first set of inputs of said fifth latch set circuit means;
- means connecting said first set of outputs of said fifth latch set circuit means with said first set of inputs of said sixth latch set circuit means;
- scan-out means connected to said first set of outputs of said sixth latch set circuit means;
- first interconnection means interconnecting said plurality of primary inputs, said second set of inputs of said first combinational logic circuit means, said third set of inputs of said array circuit means, said second set of inputs of said second combinational logic circuit means, said second set of inputs of said first latch set circuit means, said second set of inputs of said second latch set circuit means and said second set of inputs of said third latch circuit means;
- second interconnection means interconnecting said plurality of primary outputs, said fourth set of outputs of said first combinational logic circuit means, said third set of outputs of said array circuit means, said second set of outputs of said second combinational logic circuit means, said second set of outputs of said fourth latch set circuit means, said second set of outputs of said fifth latch set circuit means, and said second set of outputs of said sixth latch set circuit means;
- and feedback means selectively interconnecting said first and second interconnection means;

said method including at least the following steps:
a. conditioning and propagation delay testing a single-sided delay dependent level sensitive path through said unit where said path passes through said first combinational logic circuit means, said array circuit means and said second combinational logic circuit means;
b. conditioning and propagation delay testing a single-sided delay dependent level sensitive path through said unit where said path passes through only said first combinational logic circuit means;
c. conditioning and propagation delay testing a single-sided delay dependent level sensitive path through said unit where said path passes through only said array circuit means;
d. conditioning and propagation delay testing a single-sided delay dependent level sensitive path through said unit, where said path passes through only said second combinational logic circuit means;
e. conditioning and propagation delay testing a single-sided delay dependent level sensitive path through said unit where said path passes through only said first combinational logic circuit means and said array circuit means;
f. conditioning and propagation delay testing a single-sided delay dependent level sensitive path through said unit where said path passes through only said array circuit means and said second combinational logic circuit means; and
g. conditioning and propagation delay testing a single-sided delay dependent level sensitive path through said unit where said path passes through only said first combinational logic circuit means and said second combinational logic circuit means.

19. A method of propagation delay testing a single-sided level sensitive embedded array logic unit as recited in claim 18 wherein said array circuit means comprises a programmable logic array (PLA).

20. A method of propagation delay testing a single-sided level sensitive embedded array logic unit as recited in claim 18 wherein said array circuit means comprises an $m \times n$ read/write random access memory array.

21. A method of propagation delay testing a single-sided delay dependent level sensitive embedded array logic unit, said logic unit comprising:
 a plurality of primary inputs;
 a plurality of primary outputs;
 first combinational logic circuit means having a first set of inputs, a second set of inputs, a first set of outputs, a second set of outputs, a third set of outputs, and a fourth set of outputs;
 array circuit means having a first set of inputs, a second set of inputs, a third set of inputs, a first set of outputs, a second set of outputs and a third set of outputs;
 second combinational logic circuit means having a first set of inputs, a second set of inputs, a third set of inputs, a fourth set of inputs, a first set of outputs, and a second set of outputs;
 first, second, third, fourth, fifth and sixth latch set circuit means, each of said latch circuit means having, first and second sets of inputs, and first and second sets of outputs;
 means connecting said second set of outputs of said first latch set circuit means to said fourth set of inputs of said second combinational circuit means;
 means connecting said second set of outputs of said second latch set circuit means to said first set of inputs of said array circuit means;
 means connecting said second set of outputs of said third latch set circuit means to said first set of inputs of said first combinational logic circuit means;
 means connecting said first set of outputs of said first combinational logic circuit means to said second set of inputs of said array circuit means;
 means connecting said first set of outputs of said array circuit means to said first set of inputs of said second combinational logic circuit means;
 means connecting said second set of outputs of said first combinational logic circuit means with said third set of inputs of said second combinational logic circuit means;
 means connecting said first set of outputs of said second combinational logic circuit means to said second set of inputs of said fourth latch set circuit means;
 means connecting said second set of outputs of said array circuit means to said second set of inputs of said fifth latch set circuit means;
 means connecting said third set of outputs of said first combinational logic circuit means to said second set of inputs of said sixth latch set circuit means;
 scan-in means connected to said first set of inputs of said first latch set circuit means;
 means connecting said first set of outputs of said first latch set circuit means to said first set of inputs of said second latch set circuit means;
 means connecting said first set of outputs of said second latch set circuit means to said first set of inputs of said third latch set circuit means;
 means connecting said first set of outputs of said third latch set circuit means to said first set of inputs of said fourth latch set circuit means;
 means connecting said first set of outputs of said fourth latch set circuit means with said first set of inputs of said fifth latch set circuit means;
 means connecting said first set of outputs of said fifth latch set circuit means with said first set of inputs of said sixth latch set circuit means;
 scan-out means connected to said first set of outputs of said sixth latch set circuit means;
 first interconnection means interconnecting said plurality of primary inputs, said second set of inputs of said first combinational logic circuit means, said third set of inputs of said array circuit means, said second set of inputs of said second combinational logic circuit means, said second set of inputs of said first latch set circuit means, said second set of inputs of said second latch set circuit means and said second set of inputs of said third latch circuit means;
 second interconnection means interconnecting said plurality of primary outputs, said fourth set of outputs of said first combinational logic circuit means, said third set of outputs of said array circuit means, said second set of outputs of said second combinational logic circuit means, said second set of outputs of said fourth latch set circuit means, said second set of outputs of said fifth latch set circuit means, and said second set of outputs of said sixth latch set circuit means;
 and feedback means selectively interconnecting said first and second interconnection means;
 said method including at least the following steps:
 a. shut off system clocks;
 b. apply a test pattern via said scan-in means to at least said first, second and third latch set circuit means;
 c. apply a test pattern to said primary inputs;
 d. change a primary input;
 e. clock array circuit means;
 f. turn on at least one system clock;
 g. capture result in said fourth, fifth and sixth latch set circuit means;
 h. shut off said at least one system clock;
 i. compare result captured in said fourth, fifth and sixth latch set circuit means with a known expected result.

22. A method of propagation delay testing a single-sided delay dependent level sensitive embedded array logic unit, as recited in claim 21 wherein subsequent to step (h) and prior to step (i) the following step is performed:
 a. utilize scan-out means to scan-out the result captured in said fourth, fifth and sixth latch circuit means.

23. A method of propagation delay testing a single-sided delay dependent level sensitive embedded array logic unit, said logic unit comprising:
 a plurality of primary inputs;
 a plurality of primary outputs;
 first combinational logic circuit means having a first set of inputs, a second set of inputs, a first set of outputs, a second set of outputs, a third set of outputs, and a fourth set of outputs;
 array circuit means having a first set of inputs, a second set of inputs, a third set of inputs, a first set of outputs, a second set of outputs and a third set of outputs;
 second combinational logic circuit means having a first set of inputs, a second set of inputs, a third set of inputs, a fourth set of inputs, a first set of outputs, and a second set of outputs;
 first, second, third, fourth, fifth and sixth latch set circuit means, each of said latch circuit means having, first and second sets of inputs, and first and second sets of outputs;

means connecting said second set of outputs of said first latch set circuit means to said fourth set of inputs of said second combinational circuit means;

means connecting said second set of outputs of said second latch set circuit means to first set of inputs of said array circuit means;

means connecting said second set of outputs of said third latch set circuit means to said first set of inputs of said first combinational logic circuit means;

means connecting said first set of outputs of said first combinational logic circuit means to said second set of inputs of said array circuit means;

means connecting said first set of outputs of said array circuit means to said first set of inputs of said second combinational logic circuit means;

means connecting said second set of outputs of said first combinational logic circuit means with said third set of inputs of said second combinational logic circuit means;

means connecting said first set of outputs of said second combinational logic circuit means to said second set of inputs of said fourth latch set circuit means;

means connecting said second set of outputs of said array circuit means to said second set of inputs of said fifth latch set circuit means;

means connecting said third set of outputs of said first combinational logic circuit means to said second set of inputs of said sixth latch set circuit means;

scan-in means connected to said first set of inputs of said first latch set circuit means;

means connecting said first set of outputs of said first latch set circuit means to said first set of inputs of said second latch set circuit means;

means connecting said first set of outputs of said second latch set circuit means to said first set of inputs of said third latch set circuit means;

means connecting said first set of outputs of said third latch set circuit means to said first set of inputs of said fourth latch set circuit means;

means connecting said first set of outputs of said fourth latch set circuit means with said first set of inputs of said fifth latch set circuit means;

means connecting said first set of outputs of said fifth latch set circuit means with said first set of inputs of said sixth latch set circuit means;

scan-out means connected to said first set of outputs of said sixth latch set circuit means;

first interconnection means interconnecting said plurality of primary inputs, said second set of inputs of said first combinational logic circuit means, said third set of inputs of said array circuit means, said second set of inputs of said second combinational logic circuit means, said second set of inputs of said first latch set circuit means, said second set of inputs of said second latch set circuit means and said second set of inputs of said third latch set circuit means;

second interconnection means interconnecting said plurality of primary outputs, said fourth set of outputs of said first combinational logic circuit means, said third set of outputs of said array circuit means, said second set of outputs of said second combinational logic circuit means, said second set of outputs of said fourth latch set circuit means, said second set of outputs of said fifth latch set circuit means, and said second set of outputs of said sixth latch set circuit means;

feedback means selectively interconnecting said first and second interconnection means; and, clocking means connected to at least said latch set circuit means;

said method including at least the following steps:

a. applying a test pattern to at least certain ones of said first through sixth latch set circuit means and at least certain of said primary inputs;

b. activate said clocking means;

c. compare the state of at least certain ones of said first through sixth latch circuit means with a known resultant expected state of said certain ones of said first through sixth latch set circuit means.

24. A method of propagation delay testing a single-sided delay dependent level sensitive embedded array logic unit, at least first and second system clocks coupled to said unit, said unit having primary inputs and primary outputs and formed of combinational network circuit means, array circuit means and at least first, second, third, fourth, fifth and sixth latch set circuit means, said at least first through sixth latch set circuit means including access for scanning and control means independent of said primary inputs and outputs, said method including the following steps:

a. shut off system clocks;

b. apply a test pattern via said access for scanning and control means to at least said first, second and third latch set circuit means;

c. apply a test pattern to said primary inputs;

d. change a primary input;

e. turn on at least one system clock;

f. capture result in said fourth, fifth and sixth latch circuit means;

g. shut off said at least one system clock;

h. compare result captured in said fourth, fifth and sixth latch set circuit means with expected result.

25. A method of propagation delay testing a single-sided delay dependent level sensitive embeded array logic unit, at least first and second system clocks coupled to said unit, said unit having primary inputs and primary outputs and formed of combinational network circuit means, array circuit means and at least one shift register having shift register input, output and control means independent of said primary inputs and outputs, said method employing test apparatus having storage elements coupled to at least certain ones of said primary inputs and auxiliary latch circuit means coupled to at least certain ones of said primary outputs and said shift register, said method including the following steps:

a. shut off system clocks;

b. apply test pattern to shift register;

c. provide test patterns to storage elements in testing apparatus;

d. activate shift register control;

e. activate said first system clock;

f. after a predetermined time activate second system clock for capturing the test result;

g. shut off system clocks and read out the result; and h. compare result with known expected result.

* * * * *